United States Patent
Horie et al.

(10) Patent No.: US 8,841,735 B2
(45) Date of Patent: Sep. 23, 2014

(54) CAPACITIVE PRESSURE SENSING SEMICONDUCTOR DEVICE

(71) Applicant: Wacom Co., Ltd., Saitama (JP)

(72) Inventors: Toshihiko Horie, Saitama (JP); Hidetaka Takiguchi, Saitama (JP)

(73) Assignee: Wacom Co., Ltd., Saitama (JP)

( * ) Notice: Subject to any disclaimer, the term of this patent is extended or adjusted under 35 U.S.C. 154(b) by 0 days.

(21) Appl. No.: 13/728,699

(22) Filed: Dec. 27, 2012

(65) Prior Publication Data
US 2013/0193532 A1    Aug. 1, 2013

(30) Foreign Application Priority Data

Jan. 27, 2012    (JP) .................................. 2012-015254

(51) Int. Cl.
*H01L 29/84*    (2006.01)
*G01L 9/12*    (2006.01)
*G01L 9/00*    (2006.01)
*G01L 1/14*    (2006.01)

(52) U.S. Cl.
CPC .............. *H01L 29/84* (2013.01); *G01L 9/0073* (2013.01); *G01L 1/148* (2013.01)
USPC .... 257/415; 257/418; 257/419; 257/E29.324; 73/717; 73/718; 73/724

(58) Field of Classification Search
CPC ..... G01L 9/0005; G01L 9/0072; G01L 1/142; H01G 5/16
USPC ............ 73/717, 718, 724; 257/415, 418, 419, 257/E29.324
See application file for complete search history.

(56) References Cited

U.S. PATENT DOCUMENTS

| 6,564,643 | B1 * | 5/2003 | Horie et al. ...................... 73/724 |
| 2002/0194919 | A1 | 12/2002 | Lee et al. |
| 2003/0156743 | A1 * | 8/2003 | Okada et al. .................. 382/124 |
| 2005/0132814 | A1 * | 6/2005 | Satou et al. ..................... 73/715 |
| 2007/0262401 | A1 * | 11/2007 | Yokoyama et al. ........... 257/415 |
| 2012/0228109 | A1 * | 9/2012 | Wang et al. ................... 200/600 |

FOREIGN PATENT DOCUMENTS

| JP | H4-96212 A | 3/1992 |
| JP | H11-284204 A | 10/1999 |
| JP | 2001-83030 A | 3/2001 |
| JP | 2004-309282 A | 11/2004 |

* cited by examiner

*Primary Examiner* — Dao H Nguyen
(74) *Attorney, Agent, or Firm* — Seed Law Group PLLC

(57) ABSTRACT

A capacitive pressure sensing semiconductor device is provided, which has pressure resistance against pressure applied by a pressing member and can detect the pressure surely and efficiently. The pressure sensing semiconductor device includes a pressure detecting part, which detects pressure as a change in capacitance, and a package that receives the pressure detecting part within. The pressure detecting part includes a first electrode and a second electrode disposed to oppose the first electrode, with a determined distance therebetween. Capacitance is formed between the first electrode and the second electrode, and changes according to a change in said distance caused by pressure transmitted to the first electrode by a pressing member. The package also includes a pressure transmitting member that transmits, to the first electrode of the pressure detecting part, the pressure applied by the pressing member.

15 Claims, 13 Drawing Sheets

FIG.14A
FIG.14B
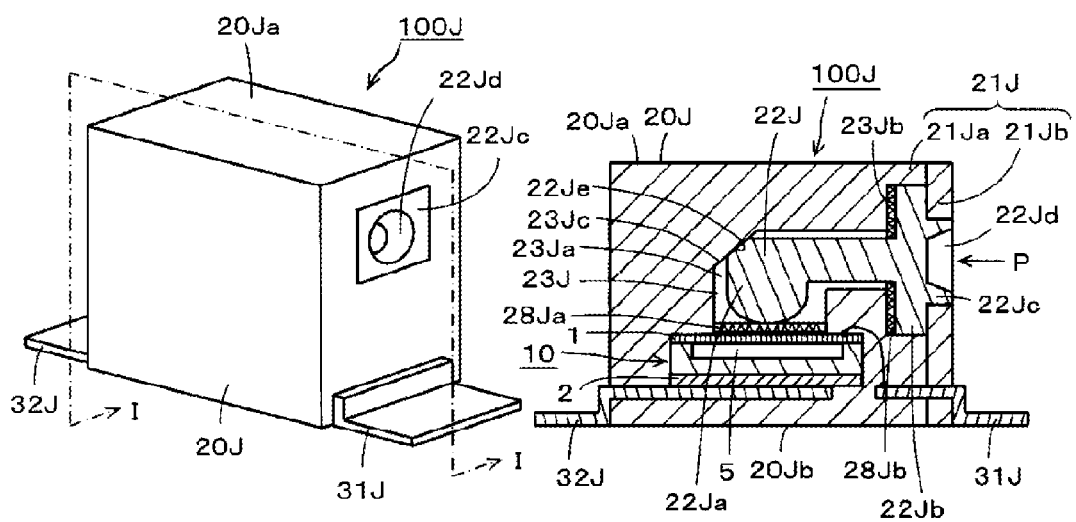
FIG.15A
FIG.15B
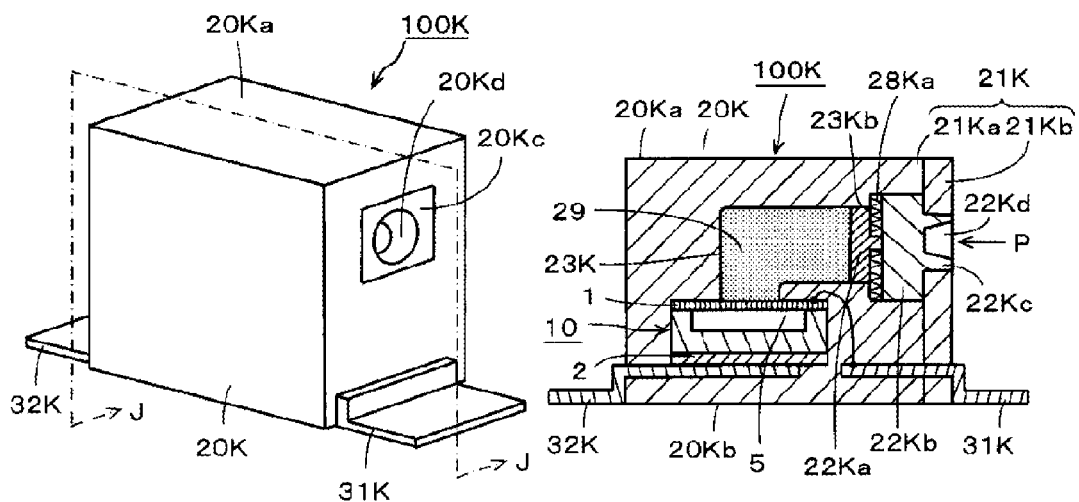

CAPACITIVE PRESSURE SENSING SEMICONDUCTOR DEVICE

CROSS-REFERENCE(S) TO RELATED APPLICATION(S)

The present application claims priority under 35 U.S.C. 119(a) of Japanese Application No. 2012-015254, filed Jan. 27, 2012, the entire content of which is incorporated herein by reference.

BACKGROUND

1. Technical Field

This invention relates to a capacitive pressure sensing semiconductor device that detects pressure applied from the external as change in capacitance.

2. Description of the Related Art

As one example of a position input device used as an input device for a personal computer and so forth, a device is known that consists of a position indicator having a pen-like shape, for example, and including a writing pressure detector, and a position detecting device having an input surface on which pointing operation and input of characters, figures, etc. are performed with the position indicator.

As the writing pressure detector of the position indicator, a capacitance-variable capacitor, for example, like that described in Patent Document 1 (Japanese Patent Laid-open No. Hei 4-96212) is used. The capacitance-variable capacitor described in Patent Document 1 has, as mechanical structural parts, a first electrode attached to one surface of a dielectric and a second electrode that is disposed on the other surface side of the dielectric opposed to said one surface and that has flexibility. The capacitance-variable capacitor further includes spacer means that separates the second electrode from said other surface of the dielectric by a slight gap except for a partial area, and still further includes a part that applies relative pressure or displacement force between the second electrode and the dielectric. When a writing pressure is applied to the position indicator having a pen shape, the flexible second electrode is displaced, which changes the capacitance.

Therefore, the capacitance-variable capacitor of the position indicator in Patent Document 1 has a large number of parts and these parts are mechanical parts. Thus, structure of the position indicator is rather complicated.

On the other hand, capacitive pressure sensors fabricated by a semiconductor microfabrication technique typified by a micro electro mechanical system (MEMS), for example, have been proposed as disclosed in Patent Document 2 (Japanese Patent Laid-open No. Hei 11-284204), Patent Document 3 (Japanese Patent Laid-open No. 2001-83030), Patent Document 4 (Japanese Patent Laid-open No. 2004-309282), and Patent Document 5 (U.S. Published Application No. 2002/0194919), for example.

The pressure sensors disclosed in Patent Document 2 to Patent Document 5 have a semiconductor structure including a first electrode and a second electrode disposed opposed to the first electrode at a predetermined distance. The distance between the first electrode and the second electrode changes depending on the pressure applied to the first electrode. Thereby, the capacitance formed between the first electrode and the second electrode changes. Thus, the pressure can be detected as a change in the capacitance.

PRIOR ART DOCUMENTS

Patent Documents

[Patent Document 1] Japanese Patent Laid-open No. Hei 4-96212
[Patent Document 2] Japanese Patent Laid-open No. Hei 11-284204
[Patent Document 3] Japanese Patent Laid-open No. 2001-83030
[Patent Document 4] Japanese Patent Laid-open No. 2004-309282
[Patent Document 5] U.S. Published Application No. 2002/0194919

BRIEF SUMMARY

Problems to be Solved by the Invention

If the capacitance-variable capacitor made with plural mechanical structural parts in order to allow the capacitance to be varied by pressing force from the external, like that of the above-described Patent Document 1, can be replaced by the pressure sensor configured by the MEMS technique, described in Patent Document 2 to Patent Document 5, the number of parts can be reduced. In addition, because no mechanical parts need to be assembled, the structure is simplified, which contributes to enhancing reliability and reducing cost.

The pressure sensor that detects pressing force from the external like the one for detecting writing pressure of the position indicator described in the above-described Patent Document 1 needs to have a structure to withstand a high pressure, which is far greater than the pressure level of a sound pressure, for example. In addition, it is preferable for the pressure sensor to have such a structure as to be capable of surely and efficiently detecting a pressure from a specific direction, such as a pressure along the axial core direction of the position indicator having a pen shape, for example.

However, the pressure sensors of Patent Document 2 and Patent Document 3 detect the pressure of fluid such as water and the air, and cannot be used as sensors for detecting writing pressure of the above-described position indicator.

In the pressure sensors of Patent Document 4 and Patent Document 5, a ceramic layer or a semiconductor substrate composed of silicon, for example, receives a pressure and is bent so as to change the distance between the first electrode and the second electrode, to thereby change the capacitance. However, Patent Document 4 and Patent Document 5 only describe how the ceramic layer or the semiconductor substrate behaves when a pressure is applied directly to the ceramic layer or the semiconductor substrate, and do not disclose any structure necessary to withstand pressure when the sensor is used for detecting writing pressure of the above-described position indicator or any structure for detecting the pressure surely and efficiently. Furthermore, they include no description about the shock resistance against a pressure unexpectedly applied to the first electrode or the second electrode.

In view of the above points, according to one aspect of the invention, a capacitive pressure sensing semiconductor device is provided, which has pressure resistance against pressure attributed to pressing force applied from the external and can detect the pressure surely and efficiently. In addition, it has a structure having shock resistance against unexpected pressing force applied from the external.

Means for Solving the Problems

To solve the above-described problems, the invention provides a capacitive pressure sensing semiconductor device including a pressure detecting part that detects pressure as a change in capacitance and a package that seals the pressure detecting part within. In the capacitive pressure sensing semiconductor device, the pressure detecting part includes a first electrode and a second electrode disposed opposed to the first electrode at a predetermined distance, and capacitance is formed between the first electrode and the second electrode. Said distance between the first electrode and the second electrode changes depending on pressure transmitted to the first electrode by a pressing member, to thereby change said capacitance. Said package includes a pressure transmitting member that has predetermined elasticity and transmits, to the first electrode of the pressure detecting part, the pressure applied by the pressing member.

In the embodiment of the invention having the above-described configuration, in the capacitive pressure sensing semiconductor device including the pressure detecting part that detects pressure as a change in capacitance, and the package that seals the pressure detecting part within, the pressure transmitting member having predetermined elasticity is disposed in the package in such a manner as to be monolithic with the package or be connected to the package. The pressure applied by the pressing member is transmitted to the first electrode of the pressure detecting part via the pressure transmitting member having predetermined elasticity. The distance between the first electrode and the second electrode forming the capacitance changes depending on the pressure transmitted to the first electrode, to thereby change the capacitance.

Therefore, due to the existence of the pressure transmitting member having predetermined elasticity, direct pressure application to the first electrode of the pressure detecting part is avoided. This allows the capacitive pressure sensing semiconductor device according to the invention to have pressure resistance against pressure attributed to pressing force applied from the external.

Furthermore, because the first electrode of the pressure detecting part receives pressure via the pressure transmitting member having predetermined elasticity, the pressure from the external pressing member can be properly transmitted to the first electrode by the pressure transmitting member, and the pressure detecting part can detect the pressure surely and efficiently.

Moreover, because the pressure transmitting member having predetermined elasticity exists, the capacitive pressure sensing semiconductor device also has shock resistance against an unexpectedly applied shock-like pressure.

Effects of the Invention

According to the invention, the pressure detecting part is sealed in the package and pressure is applied to the pressure detecting part via the pressure transmitting member having predetermined elasticity. Thus, a capacitive pressure sensing semiconductor device can be provided, which has pressure resistance against pressure attributed to pressing force applied from the external and which can detect the pressure surely and efficiently. In addition, it has shock resistance against unexpected shock-like pressing force.

BRIEF DESCRIPTION OF THE SEVERAL VIEWS OF THE DRAWINGS

FIGS. 14A and 14B are diagrams for explaining a configuration example of a sixth embodiment of the capacitive pressure sensing semiconductor device according to the invention.

FIGS. 15A and 15B are diagrams for explaining a configuration example of a seventh embodiment of the capacitive pressure sensing semiconductor device according to the invention.

DETAILED DESCRIPTION

First Embodiment

Figure 1A:
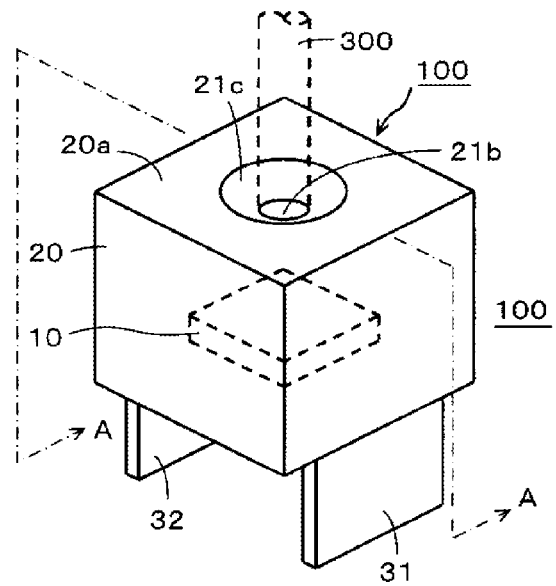
FIGS. 1A to 1C are diagrams showing a basic configuration example of a first embodiment of a capacitive pressure sensing semiconductor device according to the invention.
Figure 1B:
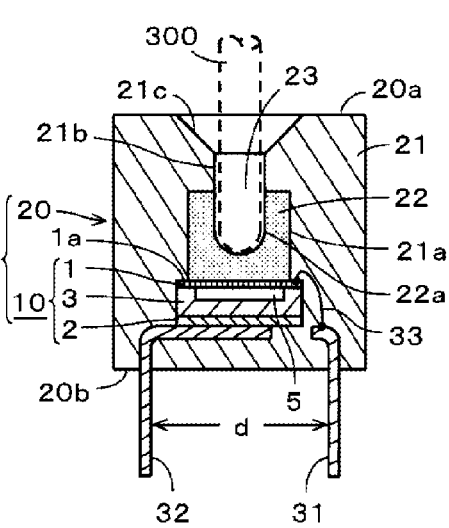
Figure 1C:
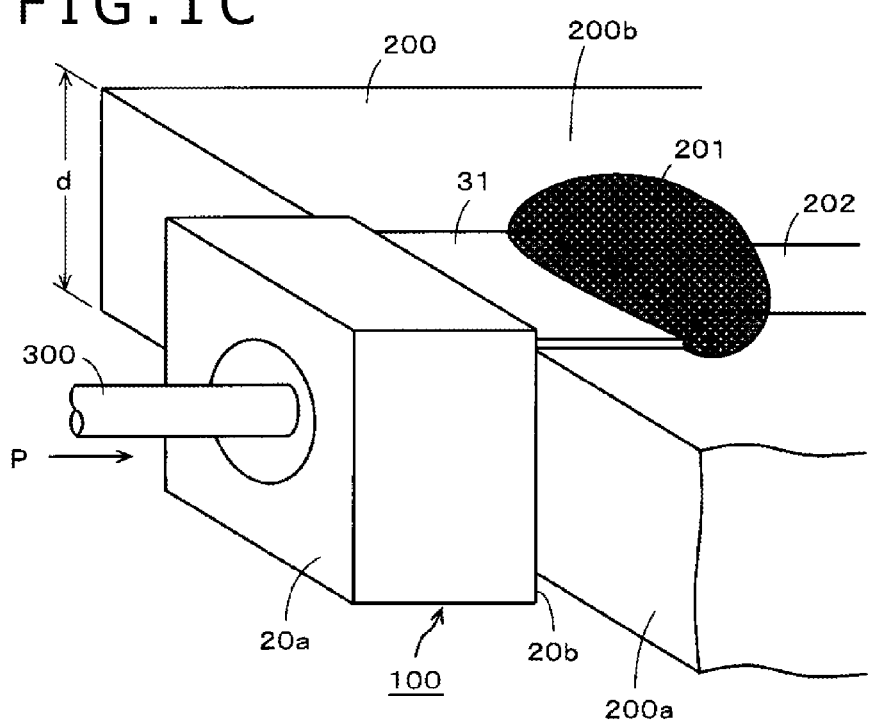

FIGS. 1A to 1C are diagrams for explaining the configuration of a first embodiment of a capacitive pressure sensing semiconductor device (hereinafter, referred to as the pressure sensing semiconductor device) according to the invention. FIG. 1A is a perspective view of a pressure sensing semiconductor device 100 of the first embodiment. FIG. 1B is a longitudinal sectional view including line A-A in FIG. 1A. FIG. 1C is a diagram showing the state when the pressure sensing semiconductor device 100 of the first embodiment is attached to a printed wiring board 200.

In the pressure sensing semiconductor device 100 of the first embodiment, a pressure detecting chip 10 configured as a semiconductor chip fabricated by a MEMS technique, for example, is sealed in a package 20 having a cubic or rectangular parallelepiped box shape, for example (see FIGS. 1A and 1B). The pressure detecting chip 10 is one example of the pressure detecting part.

Figure 2A:
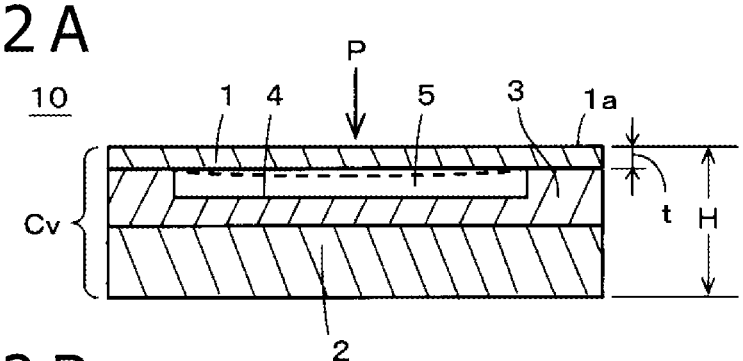
FIGS. 2A to 2C are diagrams showing a configuration example of a pressure detecting part used in the capacitive pressure sensing semiconductor device according to the invention.
Figure 2B:
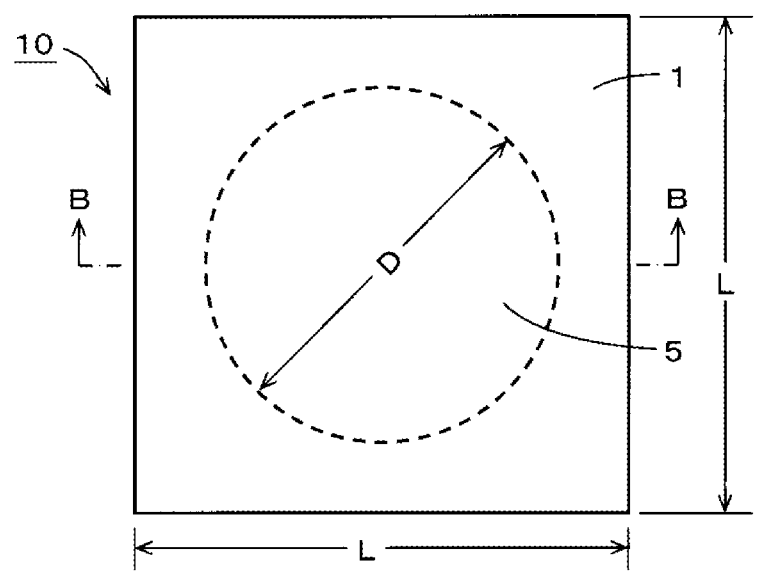
Figure 2C:
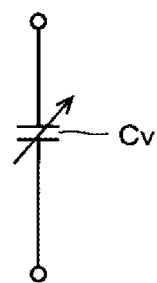

The pressure detecting chip 10 detects applied pressure as a change in the capacitance and has a configuration shown in FIGS. 2A, 2B and 2C. FIG. 2B is a diagram when the pressure detecting chip 10 of this example is viewed from the side of a surface 1a that receives a pressure P. FIG. 2A is a longitudinal sectional view along line B-B in FIG. 2B.

As shown in FIGS. 2A, 2B and 2C, the pressure detecting chip 10 of the first example has a rectangular parallelepiped shape of length×width×height=L×L×H. In this example, L=1.5 mm and H=0.5 mm.

The pressure detecting chip 10 of this example is composed of a first electrode 1, a second electrode 2, and an insulating layer (dielectric layer) 3 between the first electrode 1 and the second electrode 2. The first electrode 1 and the second electrode 2 are formed of a conductor composed of single-crystal silicon (Si) in this example. The insulating layer 3 is formed of an insulating film composed of an oxide film ($SiO_2$) in this example. The insulating layer 3 does not need to be formed of an oxide film and may be formed by another insulating material.

On the surface of the insulating layer 3 that opposes the first electrode 1, a circular recess 4 centered at the central position of the surface is formed in this example. By the recess 4, a space 5 is formed between the insulating layer 3 and the first electrode 1. In this example, the bottom surface of the recess 4 is a flat surface and the diameter D thereof is set to D=1 mm, for example. Furthermore, the depth of the recess 4 is set to several tens of microns to several hundreds of microns in this example.

The pressure detecting chip 10 of this example is fabricated by a semiconductor process in the following manner. First, the insulating layer 3 formed of an oxide film is formed on single-crystal silicon forming the second electrode 2. Next, the recess 4 is formed by disposing a mask covering the part other than the circular part with the diameter D and performing etching so that the space 5 may be formed in the insulating layer 3 of the oxide film. Then, single-crystal silicon forming the first electrode 1 is bonded onto the insulating layer 3. Thereby, the pressure detecting chip 10 having the space 5 below the first electrode 1 is formed.

The existence of the space 5 allows the first electrode 1 to be so displaced as to be bent in the direction toward the space 5 when being pressed from the side of the surface 1a, which is opposite to the surface that opposes (faces) the second electrode 2. The thickness "t" of the single-crystal silicon as an example of the first electrode 1 is set so as to allow bending when pressure P is applied, and is set smaller than the thickness of the second electrode 2. The thickness "t" of the first electrode 1 is so selected as to achieve a desirable bending displacement characteristic for the first electrode 1 as a function of the applied pressure P, as described later.

In the pressure detecting chip 10 having the above-described configuration, capacitance Cv is formed between the first electrode 1 and the second electrode 2. When the pressure P is applied to the first electrode 1 from the side of the top surface 1a of the first electrode 1, which is opposite to the surface that opposes the second electrode 2 as shown in FIG. 2A, the first electrode 1 bends as shown by the dotted line in FIG. 2A and the distance between the first electrode 1 and the second electrode 2 is shortened. Thus, the value of the capacitance Cv changes to become larger. The amount of bending of the first electrode 1 changes depending on the magnitude of the applied pressure P. Therefore, the capacitance Cv changes depending on the magnitude of the pressure P applied to the pressure detecting chip 10 as shown by an equivalent circuit of FIG. 2C.

Bending by several microns is caused by pressure in the single-crystal silicon, which is shown as an example of the first electrode 1. The capacitance of the capacitor Cv shows a change of 0 to 10 pF (picofarad) due to the pressing force P that causes the bending.

In the pressure sensing semiconductor device 100 of this embodiment, the pressure detecting chip 10 having the above-described configuration is housed in the package 20 in the state in which the surface 1a of the first electrode 1, which receives pressure, opposes (faces) a top surface 20a of the package 20 in FIGS. 1A and 1B.

In this example, the package 20 is composed of a package member 21 formed of an electrically insulating material such as a ceramic material and a resin material, and an elastic member 22 provided in the package member 21 on the surface 1a, across which the pressure detecting chip 10 receives pressure. The elastic member 22 is one example of the pressure transmitting member having predetermined elasticity.

In this example, a recess 21a corresponding to the area of the first electrode 1 is provided in the package member above the surface 1a of the first electrode 1, across which the pressure detecting chip 10 receives pressure. The elastic member 22 is so disposed as to be packed in this recess 21a. In this example, the elastic member 22 is formed of a silicone resin having predetermined elasticity, for example silicone rubber.

In the package 20, a communication hole 23 that communicates from the top surface 20a to a portion of the elastic member 22 is formed. Specifically, a penetrating hole 21b that forms part of the communication hole 23 is defined in the package member 21 and a concave hole 22a that forms an end part of the communication hole 23 is made in the elastic member 22. Furthermore, a taper part 21c is formed in the opening part of the communication hole 23 of the package member 21 (on the side of the top surface 20a) and the opening part of the communication hole 23 is formed into a trumpet shape.

As shown by the dotted line in FIGS. 1A and 1B, a rod-shaped protruding member 300 is inserted in the communication hole 23 as the pressing member for applying pressure from the external, such as a pressing force by the user, to the pressure sensing semiconductor device 100. In this case, the pressure P from the external is applied along the axial core direction of the rod-shaped protruding member 300 (i.e., along the center line direction). In this example, the inner diameter of the penetrating hole 21b is set slightly larger than the diameter of the part of the protruding member 300 abutting against the penetrating hole 21b. In addition, the inner diameter of the concave hole 22a is set slightly smaller than the diameter of the part of the protruding member 300 abutting against the concave hole 22a. This provides a configuration in which guiding of the protruding member 300 to the inside of the pressure sensing semiconductor device 100 is facilitated by the taper part 21c and the penetrating hole 21b, while the protruding member 300 inserted in the pressure sensing semiconductor device 100 is prevented from easily dropping off.

Specifically, because the opening part of the communication hole 23 has a trumpet shape, the protruding member 300 is guided by the taper part 21c at the opening part to be easily led and inserted into the communication hole 23. Furthermore, the protruding member 300 is pushed to the inside of the concave hole 22a of the elastic member 22 at the end part of the communication hole 23. In this manner, the protruding member 300 is inserted into the communication hole 23 of the pressure sensing semiconductor device 100 to thereby be positioned to apply the pressure P along the axial core direction to the surface across which the pressure detecting chip 10 receives pressure.

In this case, because the inner diameter of the concave hole 22a is slightly smaller than the diameter of the part of the protruding member 300 abutting against the concave hole 22a, the protruding member 300 is elastically held by the elastic member 22 in the concave hole 22a of the elastic member 22. That is, when being inserted in the communication hole 23 of the pressure sensing semiconductor device 100, the protruding member 300 is held by the pressure sensing semiconductor device 100. On the other hand, the protruding member 300 can be easily released from the state of being held by the pressure sensing semiconductor device 100 when pulled by a predetermined force.

As shown in FIGS. 1A and 1B, from the package member 21 of the pressure sensing semiconductor device 100, a first lead terminal 31 connected to the first electrode 1 of the pressure detecting chip 10 is led out and a second lead terminal 32 connected to the second electrode 2 of the pressure detecting chip 10 is led out. The first lead terminal 31 is electrically connected to the first electrode 1 by a gold wire 33 for example. The second lead terminal 32 is electrically connected to the second electrode 2 by being led out in such a state as to be in contact with the second electrode 2. However, it is obvious that the second lead terminal 32 may also be electrically connected to the second electrode 2 by a gold wire or the like.

In this example, the first and second lead terminals 31 and 32 are formed of a conductor and have a wide width as shown in the diagram. Furthermore, in this example, the first and second lead terminals 31 and 32 are led out from a bottom surface 20b opposite from the top surface 20a of the package 20 in the direction perpendicular to the bottom surface 20b. In addition, they are so led out as to be opposed in parallel to each other with the intermediary of a gap corresponding to the thickness "d" of the printed wiring board 200, on which the pressure sensing semiconductor device 100 is disposed.

Furthermore, as shown in FIG. 1C, the pressure sensing semiconductor device 100 is so disposed that the first and second lead terminals 31 and 32 sandwich (or bind) the printed wiring board 200 therebetween along the thickness direction of the printed wiring board 200, in the state in which the bottom surface 20b of the package 20 abuts against an end surface 200a of the printed wiring board 200.

Then, a printed wiring pattern 202 provided on one surface 200b of the printed wiring board 200 is electrically connected and fixed to the first lead terminal 31 by a solder 201. Furthermore, although not shown in the diagram, similarly, a printed wiring pattern provided on the surface on the opposite side of the surface 200b of the printed wiring board 200 is fixed to the second lead terminal 32 by soldering. If a signal processing circuit (IC or the like) is provided on the side of the surface 200b of the printed wiring board 200, because the printed wiring pattern to which the second lead terminal 32 is soldered is provided on the surface on the opposite side to the surface 200b of the printed wiring board 200, this printed wiring pattern is connected to the printed wiring pattern 202 on the side of the surface 200b via a through-hole made in the printed wiring board 200 to be connected to the signal processing circuit.

When the pressing force P is applied in the axial core direction of the protruding member 300 in this state as shown in FIG. 1C, a pressure depending on the pressing force P is applied to the pressure detecting chip 10 via the elastic member 22. As described above, the capacitance Cv of the pressure detecting chip 10 changes depending on the pressure applied to the pressure detecting chip 10. Therefore, the signal processing circuit provided on the printed wiring board 200 executes signal processing corresponding to the capacitance value of the capacitance Cv.

In this case, the pressure is applied to the first electrode 1 via the elastic member 22 on the side of the surface 1a, across which the pressure detecting chip 10 receives the pressure, as shown in FIG. 1B. This causes the pressure detecting chip 10 to show the capacitance Cv depending on the pressing force P applied by the protruding member 300.

In this case, the side of the surface across which the pressure detecting chip 10 receives the pressure by the protruding member 300 is not directly pressed by the protruding member 300, and instead the elastic member 22 exists between the protruding member 300 and the pressure detecting chip 10. This enhances the pressure resistance and shock resistance on the side of the surface across which the pressure detecting chip 10 receives the pressure and can prevent this surface from being damaged by excessive pressure, unexpected instantaneous pressure, etc. That is, in the pressure sensing semiconductor device 100 of the first embodiment, the pressure detecting chip 10 receives the pressure depending on the pressing force P by the protruding member 300 from the external via the elastic member 22 as the pressure transmitting member having predetermined elasticity. Therefore, the pressure sensing semiconductor device 100 has pressure resistance and shock resistance against the pressure applied to the pressure detecting chip 10, specifically the first electrode 1, which receives the pressure.

Furthermore, the protruding member 300 as the pressing member is inserted in and guided by the communication hole 23 made in the package 20 of the pressure sensing semiconductor device 100 to thereby be positioned in the package 20. Therefore, the pressure applied by the protruding member 300 is surely transmitted to the pressure detecting chip 10 via the elastic member 22.

The pressing force applied by the protruding member 300 is transmitted as a pressure to the surface 1a of the first electrode 1 of the pressure detecting chip 10 by the elastic member 22. Therefore, the pressing force applied by the protruding member 300 is applied to the surface 1a, across which the pressure detecting chip 10 receives the pressure, and the capacitance Cv of the pressure detecting chip 10 changes corresponding to the pressing force P. That is, the pressure sensing semiconductor device 100 of this embodiment shows change in the capacitance depending on the pressing force P. Such device can be advantageously used to detect a writing pressure described above, for example.

Modification Examples of the First Embodiment

Adjustment of Pressure-Capacitance Change Characteristic

First Example

In the pressure detecting chip 10 of the pressure sensing semiconductor device 100 of the above-described first embodiment, when the thickness "t" of the single-crystal silicon forming the first electrode 1, to which pressure is applied, is changed, the amount of bending of the first electrode 1 depending on the applied pressure also varies. Therefore, by selectively determining the thickness "t" of the first electrode 1, the change characteristic of the capacitance Cv of the pressure detecting chip 10 as a function of the applied pressure P can be varied.

Figure 3:
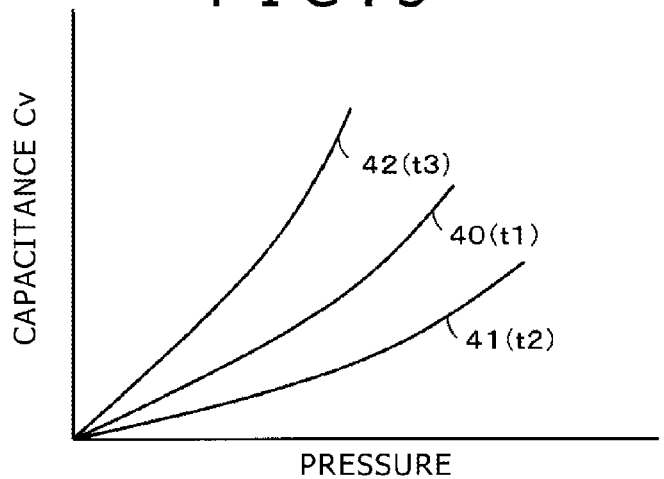
FIG. 3 is a graph showing sample characteristics of the pressure detecting part used in the capacitive pressure sensing semiconductor device according to the invention.

FIG. 3 is a characteristic diagram showing an example of the change characteristic of the capacitance Cv as a function of the pressure applied to the pressure detecting chip 10. As shown in FIG. 3, when the thickness "t" of the first electrode 1 is t1, the change characteristic of the capacitance Cv of the pressure detecting chip 10 as a function of the applied pressure is as shown by a curve 40.

When the thickness "t" of the first electrode 1 is set to t2 larger than t1 (t2>t1), the first electrode 1 bends less readily in response to the applied pressure. Therefore, although showing a change similar to that of the curve 40, the change characteristic of the capacitance Cv as a function of the applied pressure is as shown by a curve 41, which shows a gentler change than the curve 40.

When the thickness "t" of the first electrode 1 is set to t3 smaller than t1 (t3<t1), the first electrode 1 bends more readily in response to the applied pressure. Therefore, although showing a change similar to that of the curve 40, the change characteristic of the capacitance Cv as a function of the applied pressure is as shown by a curve 42, which shows a sharper change than the curve 40.

In the above-described manner, a desired change characteristic of the capacitance Cv as a function of the applied pressure can be selected by varying the thickness "t" of the first electrode 1 of the pressure detecting chip 10.

In the above-described example, the thickness "t" of the first electrode 1 is varied. However, by varying the material of the first electrode 1 to a material that bends more readily or a material that bends less readily, the change characteristic of the capacitance Cv of the pressure detecting chip 10 as a function of the applied pressure can be varied even when the thickness "t" is kept the same. In this case, it is also possible to vary the capacitance change characteristic more finely by changing the thickness "t" in addition to varying the material of the first electrode 1.

It is also possible to change the application characteristic (transmission characteristic) of pressure to the pressure detecting chip 10 by selectively determining the modulus of elasticity (elastic modulus) for the elastic member 22 or by varying the engagement relationship (e.g., the shapes of abutting elements) between the elastic member 22 and the first electrode 1, as is understood from comparison between FIG. 10B and FIG. 11B to be described later. These other methods are also available to vary the change characteristic of the capacitance Cv of the pressure detecting chip 10.

Second Example

In the above-described example, the change characteristics of the capacitance Cv as a function of the pressure applied to the pressure detecting chip 10 (as shown in FIG. 3, for example) have tendencies similar to each other. A second example is an example having a characteristic that the change rates of the change characteristic of the capacitance Cv as a function of the pressure applied to the pressure detecting chip 10, i.e., the tendencies of so-called gradient change, are different from each other.

Figure 4A:
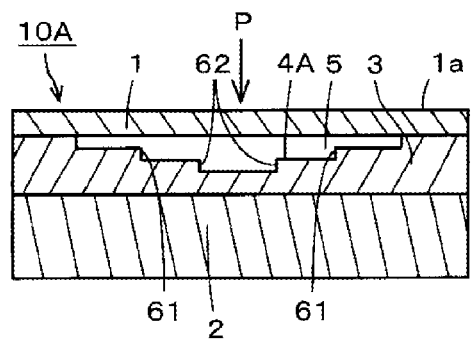
FIGS. 4A and 4B are diagrams showing other configuration examples of the pressure detecting part used in the capacitive pressure sensing semiconductor device according to the invention.
Figure 4B:
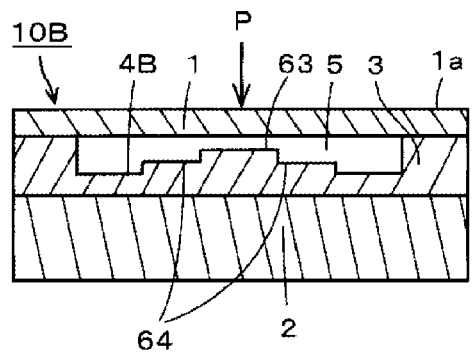

In this second example, one surface of the recess 4 of the insulating layer 3 of the pressure detecting chip 10, specifically the surface that opposes (faces) the first electrode 1 and that defines the space 5, is formed not as an evenly-flat surface but as a surface having a shape yielding uneven thickness. Thereby, a desired characteristic is obtained as the change characteristic of the capacitance Cv as a function of pressure to the pressure detecting chip 10. FIGS. 4A and 4B are diagrams for explaining pressure detecting chips 10A and 10B of the second example and are each a sectional view corresponding to the sectional view of the above-described pressure detecting chip 10 shown in FIG. 2A. In FIGS. 4A and 4B, the same parts as those of the above-described pressure detecting chip 10 are given the same reference symbols and description thereof is omitted.

In the pressure detecting chip 10A of the example of FIG. 4A, a recess 4A formed in the insulating layer 3 has a shape, in which the thickness changes in such a manner that the surface of the recess 4A that opposes the first electrode 1 gradually becomes deeper. In this example, two step parts 61 and 62 are formed to make the surface of the recess 4A that opposes the first electrode 1 gradually deeper. The step parts 61 and 62 are formed in the following manner. Specifically, after the recess 4A is formed in the above-described manner, a process is repeated to dispose a mask covering the area other than a circular area having a predetermined size in the bottom surface of the recess 4A that opposes the first electrode 1 and then to perform etching treatment. By the etching treatment, the circular area that is not covered by the mask becomes a recess whose depth is larger than that of the surrounding area, so that the step parts 61 and 62 are formed.

Figure 5:
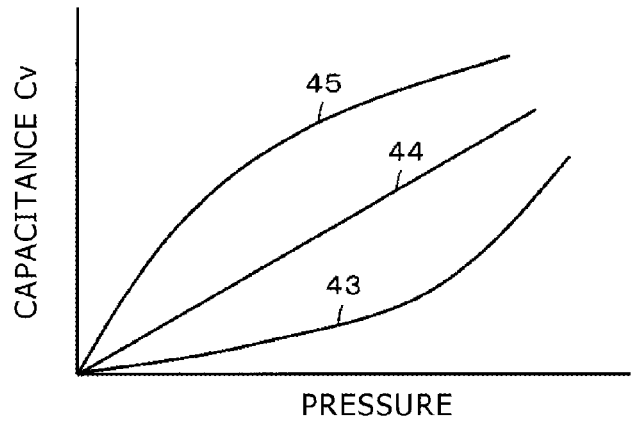
FIG. 5 is a graph showing sample characteristics of the pressure detecting part used in the capacitive pressure sensing semiconductor device in the examples of FIGS. 4A and 4B.

Suppose that a curve 43 in FIG. 5 is the characteristic curve of the capacitance Cv as a function of applied pressure in the case of the above-described pressure detecting chip 10 having the recess 4, whose surface that opposes the first electrode 1 is a flat surface. In comparison, the pressure detecting chip 10A of the example of FIG. 4A has a characteristic shown by a curve 44 in FIG. 5. Specifically, it has such a characteristic that the capacitance Cv substantially linearly changes in proportion to the applied pressure.

The method for making the shape, in which the surface of the recess 4A that opposes the first electrode 1 gradually becomes deeper in order to obtain the characteristic shown by the curve 44 in FIG. 5, is not limited to the method in which the step parts 61 and 62 are made as in the above-described example. For example, a recess having a curved surface shape such that the surface of the recess 4A that opposes the first electrode 1 becomes gradually deeper in the direction toward the center of the recess 4A may be formed.

Next, in the pressure detecting chip 10B of the example of FIG. 4B, differently from the example of FIG. 4A, a recess 4B formed in the insulating layer 3 has a shape in which the thickness changes in such a manner that the surface of the recess 4B that opposes the first electrode 1 gradually becomes closer to the first electrode 1 in the direction from the peripheral part thereof to the center part thereof. In this example, bulge parts 63 and 64 that bulge toward the first electrode 1 are formed in the surface of the recess 4B that opposes the first electrode 1.

In the case of this example, first, a mask is disposed at the part except the part of the bulge part 63 on the oxide film forming the insulating layer 3 and etching treatment is performed to turn the part of the bulge part 63 to a convex part. Next, the part of the bulge part 63 is masked and a mask is so disposed that the part of the bulge part 64 around the bulge part 63 is exposed. In this state, etching treatment is performed to form an area whose depth is larger than that of the bulge part 63 around the part of the bulge part 63 to thereby form the bulge part 64. Next, the parts of the bulge parts 63 and 64 are masked and a mask is so disposed that the part of the recess 4B around the bulge parts 63 and 64 is exposed. In this state, etching treatment is performed to form an area whose depth is larger than that of the bulge part 64 around the parts of the bulge parts 63 and 64. By repeatedly performing such treatment as needed, the space 5 is formed having such a shape that the center part bulges compared with the peripheral part, like that shown in FIG. 4B.

In the case of this example of FIG. 4B, the characteristic curve of the capacitance Cv as a function of pressure applied to the pressure detecting chip 10B is as shown by a curve 45 in FIG. 5. Specifically, in this characteristic, the capacitance greatly changes when the applied pressure is low and the change in the capacitance is small when the applied pressure is high.

The method for making such a shape that the distance between the first electrode 1 and the surface of the recess 4B that opposes the first electrode 1 becomes shorter in the direction toward the center of the recess 4B in order to obtain the characteristic shown by the curve 45 in FIG. 5 is not limited to the method in which the bulge parts 63 and 64 are formed as in the above-described example. The surface of the recess 4B that opposes the first electrode 1 may be formed into a dome shape, for example, which gradually bulges in a curved surface manner in the direction toward the center of the recess 4B.

In the above-described manner, by changing the shape of the surface of the recess 4A or 4B that defines the space 5 formed between the insulating layer 3 and the first electrode 1 and that opposes the first electrode 1, uneven (varying) distance is set between the first electrode 1 and the surface of the recess 4A or 4B that opposes the first electrode 1. Thereby, a desirable characteristic of the capacitance Cv as a function of the pressure applied to the pressure detecting chip 10A or 10B can be obtained.

As with the case of the above-described pressure detecting chip 10, a desired characteristic of the capacitance Cv as a function of the pressure applied to the pressure detecting chip 10A or 10B can be obtained also by varying the thickness "t" of the first electrode 1, the modulus of elasticity or other elasticity characteristic of the elastic member 22, or the engagement relationship (e.g., the shapes of abutting elements) between the elastic member 22 and the first electrode 1.

Specifically, the shape of the tip of the protruding member 300, which engages with the elastic member 22, may be changed to, for example, a curved surface shape, a sharpened shape, or a flat surface shape. Thereby, the manner in which the first electrode 1 bends toward the space 5 in response to pressure applied to the pressure detecting chip 10, 10A, or 10B can be varied. Also, by changing the shape of the tip of the protruding member 300, which engages with the elastic member 22, to any of various shapes as described above, the change characteristic of the capacitance Cv of the pressure detecting chip 10 as a function of applied pressure can be varied.

Alignment for Attaching a Pressure Sensing Semiconductor Device to Printed Wiring Board In the above-described embodiment, as shown in FIG. 1C, the pressure sensing semiconductor device 100 is attached to the printed wiring board 200 in the state in which the bottom surface 20b opposite to the top surface 20a of the package 20 of the pressure sensing semiconductor device 100 is pressed against the end surface 200a of the printed wiring board 200.

In this case, if the bottom surface 20b of the package 20 of the pressure sensing semiconductor device 100 is a flat surface, it is difficult to align the pressure sensing semiconductor device 100 with the end surface 200a of the printed wiring board 200. The example shown below is made to facilitate the alignment.

Figure 6A:
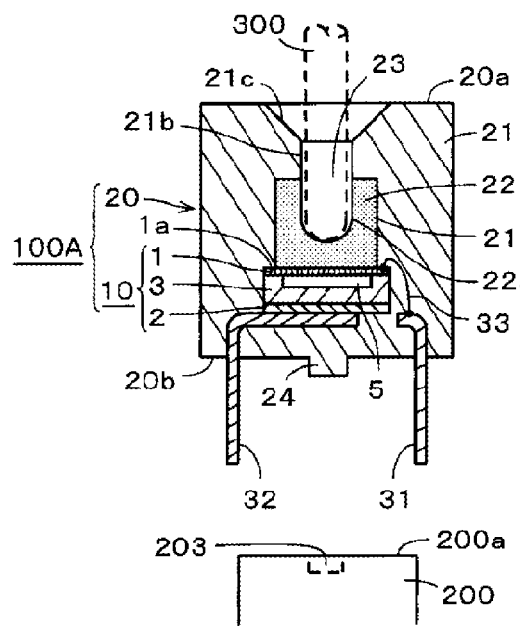
FIGS. 6A and 6B are diagrams showing modification examples of the first embodiment of the capacitive pressure sensing semiconductor device according to the invention.
Figure 6B:
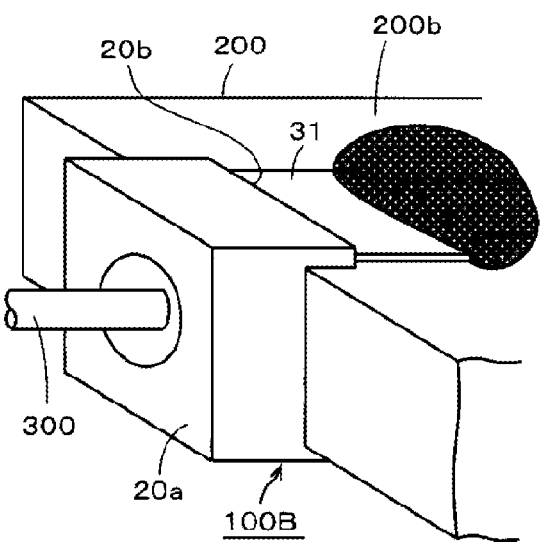

FIGS. 6A and 6B are diagrams for explaining examples of the pressure sensing semiconductor device that is so configured as to be capable of being easily aligned with the printed wiring board. FIG. 6A corresponds to the above-described FIG. 1B, which is the sectional view along line A-A, and FIG. 6B corresponds to FIG. 1C. In FIGS. 6A and 6B, the same parts as those of the pressure sensing semiconductor device 100 of the above-described example of FIGS. 1A to 1C are given the same reference symbols and description thereof is omitted.

In a pressure sensing semiconductor device 100A of the example of FIG. 6A, a projection 24 is provided, for example, at the center part of the bottom surface 20b of the package 20. Meanwhile, in the end surface 200a of the printed wiring board 200, a recess 203 is formed, into which the projection 24 of this pressure sensing semiconductor device 100A is fitted. The projection 24 may have any of shapes for alignment, such as a circular column shape, rectangular column shape, circular cone shape, circular truncated cone shape, truncated pyramid shape, and dome shape. It is obvious that the recess 203 is formed into the shape corresponding to the shape of the projection 24.

The position of the recess 203 in the end surface 200a of the printed wiring board 200 is set such that the lead terminal 31 of the pressure sensing semiconductor device 100A is electrically connected to the printed wiring pattern 202 provided on the surface 200b of the printed wiring board 200 when the printed wiring board 200 is sandwiched by the lead terminals 31 and 32 of the pressure sensing semiconductor device 100A and the projection 24 of the pressure sensing semiconductor device 100A is fitted into the recess 203. When the position is determined in this manner, the lead terminal 32 of the pressure sensing semiconductor device 100A is also so aligned as to be electrically connected to the printed wiring pattern formed on the other surface opposite to the surface 200b of the printed wiring board 200, although not shown in the diagram.

Therefore, by sandwiching the printed wiring board 200 between the lead terminals 31 and 32 of the pressure sensing semiconductor device 100A and fitting the projection 24 of the pressure sensing semiconductor device 100A into the recess 203 of the printed wiring board 200, the pressure sensing semiconductor device 100A is easily aligned with the printed wiring board 200 and further processing such as soldering can be carried out easily and surely. The projection 24 provided on the package 20 and the recess 203 made in the printed wiring board 200 can be switched with each other.

That is, it is also possible to align the package 20 and the printed wiring board 200 with each other by making a recess in the package 20 and providing a projection on the printed wiring board 200.

Furthermore, it is also possible to align the pressure sensing semiconductor device 100 with the printed wiring board 200 by notching the end surface 200a of the printed wiring board 200 to form a recess for housing the package 20 of the pressure sensing semiconductor device 100. This example is shown in FIG. 6B. A pressure sensing semiconductor device 100B of this example is aligned with the end surface 200a of the printed wiring board 200 by housing the side of the bottom surface 20b of the package 20 of the pressure sensing semiconductor device 100B in a recess 25 formed by partially notching the end surface 200a of the printed wiring board 200.

Also in this example of FIG. 6B, the pressure sensing semiconductor device 100B is easily aligned with the printed wiring board 200 and further processing such as soldering can be carried out easily, surely, and exactly as with the example of FIG. 6A.

Securing of Pressing Member (Protruding Member) 300 in Pressure Sensing Semiconductor Device In the pressure sensing semiconductor devices 100, 100A, and 100B of the above-described examples, the elastic member 22 is formed by silicone rubber and the inner diameter of the concave hole 22a, which forms part of the communication hole 23 and is made in the elastic member 22, is set slightly smaller than the diameter of the rod-shaped protruding member 300 as an example of the pressing member, to thereby hold the protruding member 300 in the communication hole 23. However, the measure to hold the rod-shaped protruding member 300 in the pressure sensing semiconductor device is not limited to this configuration.

Figure 7A:
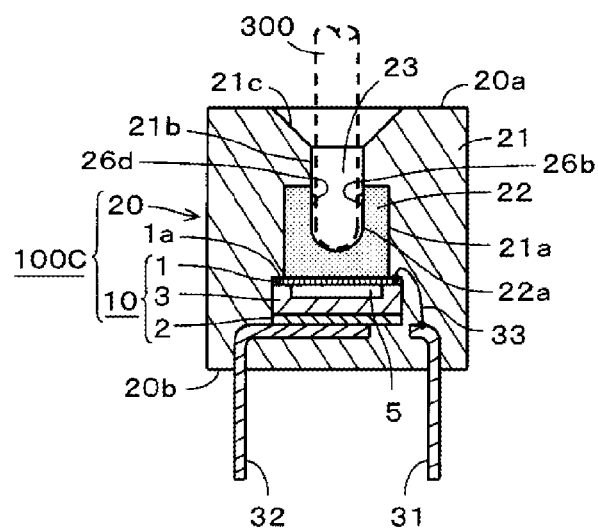
FIGS. 7A and 7B are diagrams showing another modification example of the first embodiment of the capacitive pressure sensing semiconductor device according to the invention.
Figure 7B:
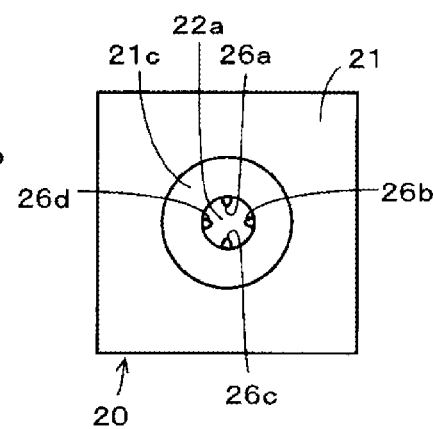

FIGS. 7A and 7B are diagrams for explaining a pressure sensing semiconductor device 100C including another example relating to the holding measure to hold the rod-shaped protruding member 300. FIG. 7A is a diagram corresponding to the above-described FIG. 1B, which is the sectional view along line A-A. FIG. 7B is a diagram viewed from the side of the top surface 20a of the package 20. In FIGS. 7A and 7B, the same parts as those of the pressure sensing semiconductor device 100 of the above-described example of FIGS. 1A to 1C are given the same reference symbols and description thereof is omitted.

In the example of FIGS. 7A and 7B, the inner diameter of the concave hole 22a of the elastic member 22 is so selected as to be almost equal to or slightly larger than the diameter of the part of the protruding member 300 abutting against the concave hole 22a. Furthermore, as shown in FIGS. 7A and 7B, plural projections, specifically four projections 26a, 26b, 26c, and 26d in the example of FIGS. 7A and 7B, are formed on the inner wall surface of the concave hole 22a of the elastic member 22 at an angular interval of 90 degrees, for example. In this case, the distance between the projection 26a and the projection 26c and the distance between the projection 26b and the projection 26d are shorter than the diameter of the part against which the protruding member 300 abuts.

According to this example of FIGS. 7A and 7B, when the protruding member 300 is inserted in the communication hole 23, the protruding member 300 is elastically held by the four projections 26a, 26b, 26c, and 26d. In addition, the protruding member 300 can be easily pulled out from the communication hole 23 of the pressure sensing semiconductor device 100C.

The number of projections formed on the inner wall surface of the concave hole 22a is at least two, preferably three or more. Such plural projections may be formed also along the center line direction of the protruding member 300.

As the holding measure to hold the rod-shaped protruding member 300, a projection in the form of an O-ring may be formed instead of providing the plural projections 26a, 26b, 26c, and 26d on the inner wall surface of the concave hole 22a of the elastic member 22. In this case also, a plurality of projections in the form of O-rings may be provided on the inner wall of the concave hole 22a of the elastic member 22, along the center line direction of the protruding member 300. In this case, the inner diameter of the projection in the form of the O-ring is set slightly smaller than the diameter of the part against which the protruding member 300 abuts.

Furthermore, it is also possible to configure the holding measure for the rod-shaped protruding member 300 by forming plural elongate protrusion bands along the center line direction of the protruding member 300 on the inner wall of the concave hole 22a of the elastic member 22.

Another Example of Method for Leading out Lead Terminals from Pressure Sensing Semiconductor Device In the pressure sensing semiconductor device of the above-described embodiment, the lead terminal 31 connected to the first electrode 1 and the lead terminal 32 connected to the second electrode 2 are led out in a manner separated from each other by the distance equal to the thickness of the printed wiring board 200. Furthermore, the pressure sensing semiconductor device is attached to the printed wiring board 200 such that the printed wiring board 200 is sandwiched along the thickness direction between the these two lead terminals 31 and 32. Therefore, the lead terminal 31 is soldered to the printed wiring pattern on one surface 200b of the printed wiring board 200 and the lead terminal 32 is soldered to the printed wiring pattern on the other surface on the opposite side of the surface 200b.

Because the lead terminal 31 and the lead terminal 32 are connected to the different surfaces of the printed wiring board 200 in this manner, when the lead terminal 32 is connected to a signal processing circuit provided on the side of the surface 200b of the printed wiring board 200, the printed wiring pattern on the other surface opposite to the surface 200b needs to be connected to an electrically-conductive pattern on the surface 200b via a through-hole, for example.

A pressure sensing semiconductor device of an example to be described below is an example in which the need for connection via a through-hole or the like is eliminated by leading out both of lead terminals corresponding to the lead terminals 31 and 32 to the side of one surface 200b of the printed wiring board 200.

Figure 8A:
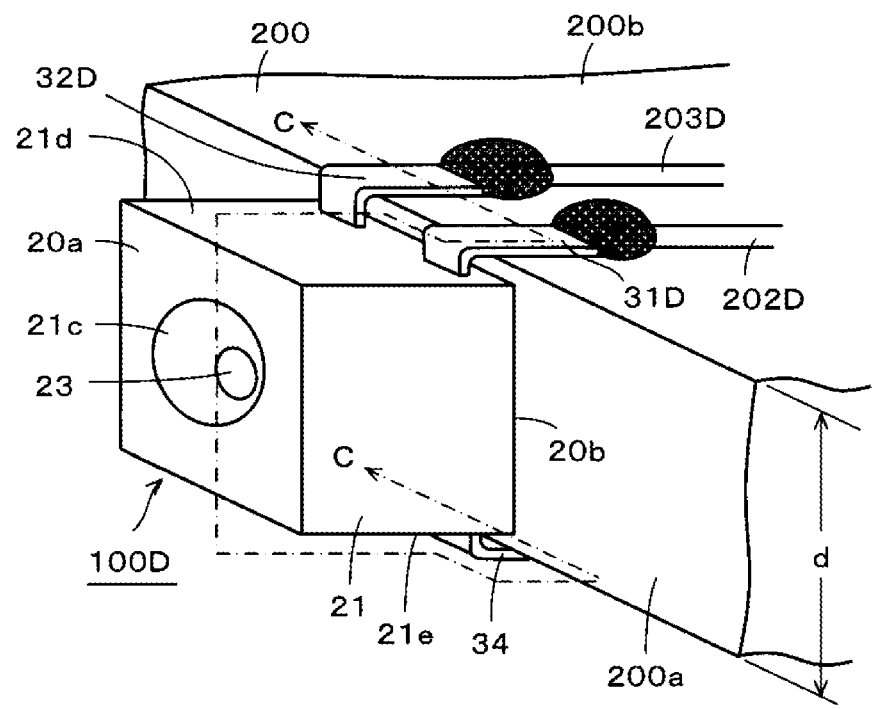
FIGS. 8A and 8B are diagrams showing yet another modification example of the first embodiment of the capacitive pressure sensing semiconductor device according to the invention.
Figure 8B:
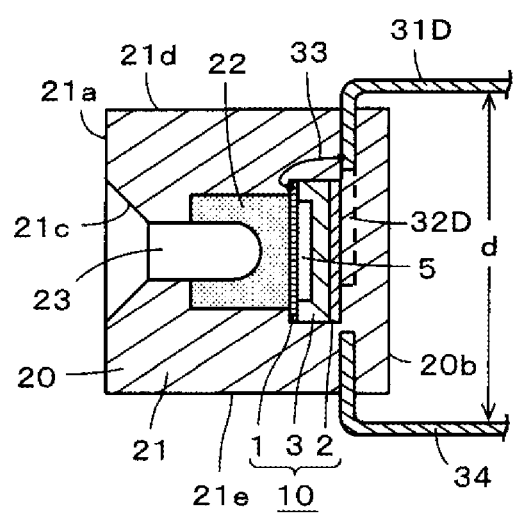

FIGS. 8A and 8B are diagrams for explaining a pressure sensing semiconductor device 100D of this example. FIG. 8A is a diagram showing the state in which this pressure sensing semiconductor device 100D is attached to the end surface 200a of the printed wiring board 200 similarly to the case of FIG. 1C. FIG. 8B is a sectional view along line C-C in FIG. 8A. In FIGS. 8A and 8B, the same parts as those of the pressure sensing semiconductor device 100 of the above-described example of FIGS. 1A to 1C are given the same reference symbols and description thereof is omitted.

In the pressure sensing semiconductor device 100D of this example of FIGS. 8A and 8B, the size of the package 20 is slightly smaller compared with the case of the example of FIGS. 1A to 1C. Furthermore, as shown in FIGS. 8A and 8B, a lead terminal 31D connected to the first electrode 1 of the pressure detecting chip 10 and a lead terminal 32D connected to the second electrode 2 are shaped so as to be led out from the side of one side surface 21d of the package member 21 of the package 20 in the direction perpendicular to the surface 21*d* and then orthogonally bent, as shown in the diagram.

Moreover, a dummy terminal 34 that is not electrically connected to the pressure detecting chip 10 is led out from a side surface 21*e* opposite to the side surface 21*d* of the package member 21. The dummy terminal 34 is also shaped so as to be orthogonally bent, as shown in the diagram. The dummy terminal 34 has a wide width similar to that of the lead terminal 32 of the above-described pressure sensing semiconductor device 100.

In this case, the orthogonally-bent parts of the lead terminals 31D and 32D led out from the side of the side surface 21*d* of the package member 21 and the orthogonally-bent part of the dummy terminal 34 led out from the other side of the side surface 21*e* are opposed to each other. The distance between them is so selected as to be almost equal to the thickness "d" of the printed wiring board 200, as shown in FIGS. 8A and 8B. The other configuration of the pressure sensing semiconductor device 100D is the same as that of the pressure sensing semiconductor device 100.

As shown in FIG. 8A, the pressure sensing semiconductor device 100D of this example is so disposed that the lead terminals 31D and 32D and the dummy terminal 34 sandwich the printed wiring board 200 therebetween along the thickness direction of the printed wiring board 200, in the state in which the bottom surface 20*b* of the package 20 abuts against the end surface 200*a* of the printed wiring board 200.

Then, printed wiring patterns 202D and 203D provided on the surface 200*b* of the printed wiring board 200 are fixed to the first lead terminal 31D and the second lead terminal 32D, respectively, by soldering. Furthermore, although not shown in the diagram, similarly, the dummy terminal 34 is fixed to a dummy wiring pattern by soldering on the surface opposite to the surface 200*b* of the printed wiring board 200.

According to the pressure sensing semiconductor device 100D of this example, the same effects as those achieved by the above-described pressure sensing semiconductor device 100 are obtained. In addition, both of the lead terminal 31D connected to the first electrode 1 of the pressure detecting chip 10 and the lead terminal 32D connected to the second electrode 2 are located on the side of the one surface 200*b* of the printed wiring board 200. This provides an effect that, differently from the pressure sensing semiconductor device 100, there is no need to provide wiring such as a through-hole for connecting the lead terminal 32 connected to the second electrode 2 to a printed wiring pattern on the side of the surface 200*b* of the printed wiring board 200.

Second Embodiment

In the pressure sensing semiconductor device of the above-described first embodiment, the elastic member as an example of the pressure transmitting member is disposed in the package. However, it is also possible to use the package member forming the package as the pressure transmitting member, by forming the package member itself with an elastic material. A second embodiment is one example of such a case.

Figure 9A:
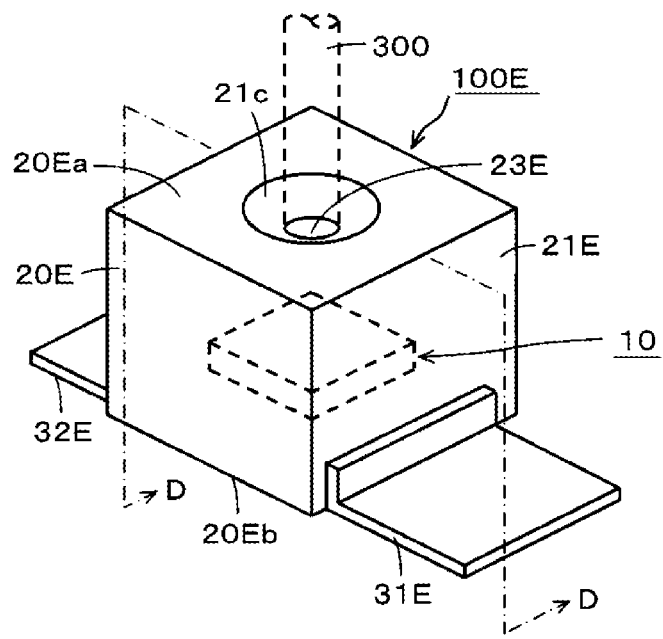
FIGS. 9A and 9B are diagrams showing a configuration example of a second embodiment of the capacitive pressure sensing semiconductor device according to the invention.
Figure 9B:
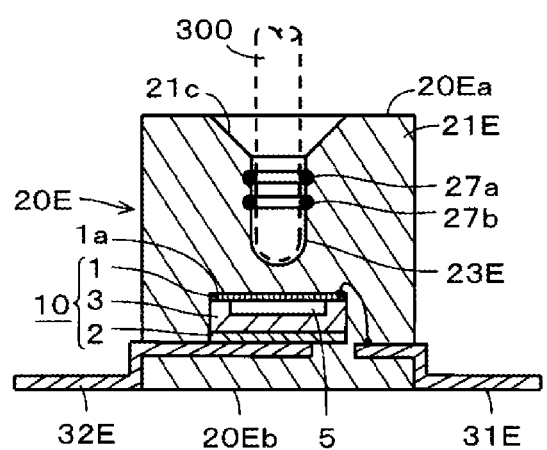

FIGS. 9A and 9B are diagrams for explaining a pressure sensing semiconductor device 100E of the second embodiment. FIG. 9A is a perspective view of the pressure sensing semiconductor device 100E of the second embodiment. FIG. 9B is a sectional view along line D-D in FIG. 9A. In FIGS. 9A and 9B, the same parts as those of the pressure sensing semiconductor device 100 of the above-described example of FIGS. 1A to 1C are given the same reference symbols and description thereof is omitted.

Specifically, a package 20E of the pressure sensing semiconductor device 100E of the second embodiment is configured by a package member 21E composed of a resin material having elasticity, for example, silicone rubber, and does not have an independent elastic member 22.

In the package member 21E, a communication hole 23E that corresponds to the communication hole 23 of the above-described pressure sensing semiconductor device 100 and has a predetermined sectional shape, for example, a circular shape, is formed. Furthermore, as shown in FIG. 9B, projections 27*a* and 27*b* in the form of an O-ring for holding the protruding member 300 of a round rod shape are provided on the inner wall surface of the communication hole 23E. Specifically, the inner diameter of the communication hole 23E is set equal to or slightly larger than the diameter of the abutting part of the protruding member 300. The inner diameter of the projections 27*a* and 27*b* in the form of O-rings is so selected as to be smaller than the diameter of the abutting part of the protruding member 300.

The first electrode 1 of the pressure detecting chip 10 is connected to a first lead terminal 31E formed of a conductor and the second electrode 2 is connected to a second lead terminal 32E formed of a conductor. In the second embodiment, the first and second lead terminals 31E and 32E are led out in parallel to a top surface 20E*a* and a bottom surface 20E*b* of the package 20E and flush with the bottom surface 20E*b*, as shown in FIGS. 9A and 9B. The other configuration of the pressure sensing semiconductor device 100E is the same as that of the pressure sensing semiconductor device 100.

The pressure sensing semiconductor device 100E of the second embodiment is so disposed that the bottom surface 20E*b* is made to abut against the surface 200*b* on which the printed wiring pattern of the printed wiring board 200 is formed. The pressure sensing semiconductor device 100E is fixed to the printed wiring board 200 by soldering the first and second lead terminals 31E and 32E to a conductor pattern.

The pressure sensing semiconductor device 100E of the second embodiment provides the same effects as those achieved by the pressure sensing semiconductor device 100 of the above-described embodiment. In addition, because the package 20E is configured with the package member 21E that additionally functions as the pressure transmitting member, the configuration of the pressure sensing semiconductor device can be made very simple.

When the pressure sensing semiconductor device 100E of the second embodiment is attached to the surface 200*b*, on which the printed wiring pattern of the printed wiring board 200 is formed, the pressure sensing semiconductor device 100E can be aligned based on a projection, recess, trench, protruding part, etc., for alignment, similarly to the case of alignment with the end surface 200*a* as shown in FIGS. 6A and 6B.

Third Embodiment

In the pressure sensing semiconductor device 100 of the above-described first embodiment, the elastic member 22 as an example of the pressure transmitting member is housed in the recess made in the package member 21. Furthermore, in the above-described second embodiment, the package member 21 is configured to also function as the pressure transmitting member. The main function of the pressure transmitting member is to transmit pressure applied by the protruding member 300 to the pressure detecting chip 10, to thereby cause elastic displacement of the pressure detecting chip 10 in correspondence to the applied pressure. From this viewpoint, pressure transmitting members having other configurations are also possible. As already described, it is preferable for the pressure transmitting member to also provide protection against an unexpected instantaneous pressure.

In a third embodiment, in consideration of the above-described functions of the pressure transmitting member, a member that is not bonded to the package member is disposed as the pressure transmitting member.

Figure 10A:
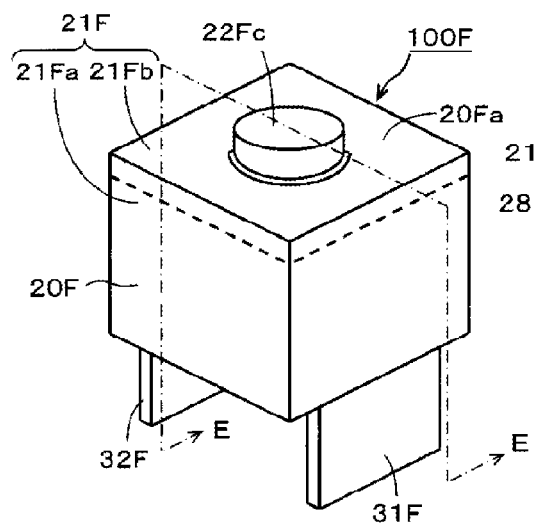
FIGS. 10A and 10B are diagrams for explaining a configuration example of a third embodiment of the capacitive pressure sensing semiconductor device according to the invention.
Figure 10B:
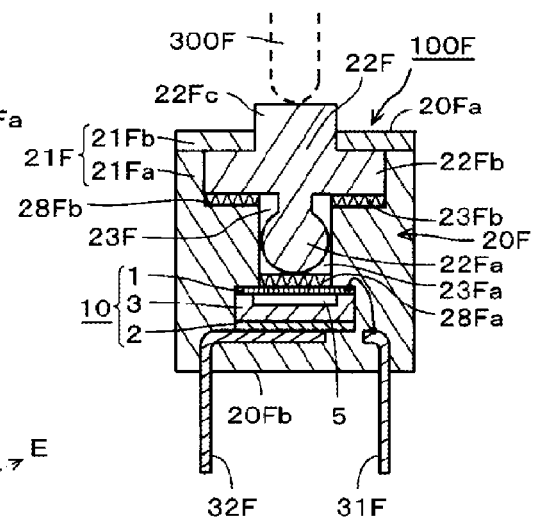

FIGS. 10A and 10B are diagrams for explaining a pressure sensing semiconductor device 100F of the third embodiment. FIG. 10A is a perspective view of the pressure sensing semiconductor device 100F of the third embodiment. FIG. 10B is a sectional view along line E-E in FIG. 10A. In FIGS. 10A and 10B, the same parts as those of the pressure sensing semiconductor device 100 of the above-described example of FIGS. 1A to 1C are given the same reference symbols and description thereof is omitted.

As shown in FIGS. 10A and 10B, in the pressure sensing semiconductor device 100F of the third embodiment, a package 20F is composed of a package member 21F and pressure transmitting members (22F, 28Fa, and 28Fb). The package member 21F is composed of a main part 21Fa and a lid part 21Fb. Furthermore, a recess 23F is formed in the main part 21Fa of the package member 21F as shown in FIG. 10B, and the pressure detecting chip 10 is so housed that the upper side of the first electrode 1 is opened to the recess 23F. In the recess 23F made above the pressure detecting chip 10, a pressing projection 22Fa forming the pressure transmitting member 22F is so housed as to oppose the first electrode 1.

In this example, a cushion member 28Fa having predetermined elasticity is formed to adhere to the top surface of the first electrode 1 of the pressure detecting chip 10. The cushion member 28Fa protects the first electrode 1 so that the first electrode 1 is not damaged due to direct contact by the pressing projection 22Fa of the pressure transmitting member 22F with the first electrode 1. In addition, the cushion member 28Fa plays a role of elastically transmitting pressure applied by a pressing member 300F via the pressure transmitting member 22F. The cushion member 28Fa is formed of, for example, silicone rubber. The modulus of elasticity and other elasticity characteristic of the cushion member 28Fa are selected depending on the desired change characteristic of the capacitance Cv of the pressure detecting chip 10 as a function of applied pressure and also depending on the shock resistance characteristic against an unexpected pressure applied by the pressing member 300F.

The pressure transmitting member 22F includes the pressing projection 22Fa that abuts against the first electrode 1 of the pressure detecting chip 10, with the intermediary of the cushion member 28Fa, a flange part 22Fb, and a pressure-application part 22Fc that is exposed to the outside of the package 20F and protrudes from a top surface 20Fa of the package 20F. The pressure-application part 22Fc receives pressing force by the pressing member 300F. In this example, the pressing projection 22Fa of the pressure transmitting member 22F is formed in a spherical shape. Furthermore, a cushion member 28Fb having predetermined elasticity is formed to adhere to the surface of the flange part 22Fb on the side of the pressing projection 22Fa. The pressure-application part 22Fc is formed in a columnar projection shape in this example.

In this example, the pressure transmitting member 22F elastically transmits pressure applied from the pressing member 300F to the first electrode 1 of the pressure detecting chip 10 due to the existence of the cushion members 28Fa and 28Fb. Therefore, differently from the cushion members 28Fa and 28Fb, the pressure transmitting member 22F itself can be formed with a resin material that does not have elasticity.

Alternatively, the pressure transmitting member 22F may be formed with a material having elasticity, for example, silicone rubber, and the cushion members 28Fa and 28Fb may have an elasticity characteristic that provides protection against an unexpected instantaneous pressure.

If the pressure transmitting member 22F is formed of an elastic body such as silicone rubber, the cushion members 28Fa and 28Fb can be omitted.

As shown in FIG. 10B, the recess 23F of the main part 21Fa of the package member 21F has a concave hole 23Fa, in which the pressing projection 22Fa of the pressure transmitting member 22F is freely movably, and a step part 23Fb with which the flange part 22Fb of the pressure transmitting member 22F engages, with the intermediary of the cushion member 28Fb.

In the pressure sensing semiconductor device 100F of the third embodiment, the pressure transmitting member 22F is mounted in the main part 21Fa of the package member 21F in such a manner that the pressing projection 22Fa of the pressure transmitting member 22F is inserted in the concave hole 23Fa of the recess 23F in the main part 21Fa of the package member 21F, in which the pressure detecting chip 10 is housed, and the flange part 22Fb of the pressure transmitting member 22F is engaged with the step part 23Fb made in the main part 21Fa of the package member 21F with the intermediary of the cushion member 28Fb. At this time, the pressure-application part 22Fc and the pressing projection 22Fa of the pressure transmitting member 22F are lined along the pressure application direction perpendicular to the surface of the first electrode 1 of the pressure detecting chip 10.

In this state, the upper part of the pressure transmitting member 22F is sealed by the lid part 21Fb of the package member 21F, with the pressure-application part 22Fc of the pressure transmitting member 22F protruded and exposed from the top surface 20Fa of the package 20F.

In the third embodiment, similarly to the pressure sensing semiconductor device 100 of the first embodiment, a first lead terminal 31F connected to the first electrode 1 and a second lead terminal 32F connected to the second electrode 2 are led out from a bottom surface 20Fb of the package 20F in the direction perpendicular to the bottom surface 20Fb.

In the pressure sensing semiconductor device 100F of the third embodiment, the tip of the pressing member 300F presses the top surface of the pressure-application part 22Fc of the pressure transmitting member 22F. In the third embodiment, the pressure-application part 22Fc is so configured as to protrude from the top surface 20Fa of the package 20F. However, it may be flush with the top surface 20Fa or recede from the top surface 20Fa toward the pressure detecting chip 10.

When pressing force by the pressing member 300F is applied to the pressure-application part 22Fc of the pressure transmitting member 22F, the pressing projection 22Fa of the pressure transmitting member 22F presses the first electrode 1 of the pressure detecting chip 10 toward the space 5 based on the elasticity of the cushion members 28Fa and 28Fb. Thereby, the first electrode 1 of the pressure detecting chip 10 is bent toward the space 5 and the capacitance Cv changes.

In the pressure sensing semiconductor device 100F of the third embodiment, the shape of the pressing projection 22Fa of the pressure transmitting member 22F is spherical. Therefore, even when the direction of the pressing force applied from the pressing member 300F is different from the direction perpendicular to the surface of the first electrode 1 of the pressure detecting chip 10, a contact between the cushion member 28Fa and the spherical pressing projection 22Fa is ensured to achieve stable abutting of the pressing projection 22Fa against the first electrode 1.

Modification Examples of Third Embodiment

In the example of FIGS. 10A and 10B, the pressure-application part 22Fc protruding from the top surface 20Fa of the package 20F is made in the pressure transmitting member 22F. As a modification thereto, a recess or a concave hole may be made, instead of the protruding shape, in order to more surely receive application of pressure by the pressing member from the external.

Figure 11A:
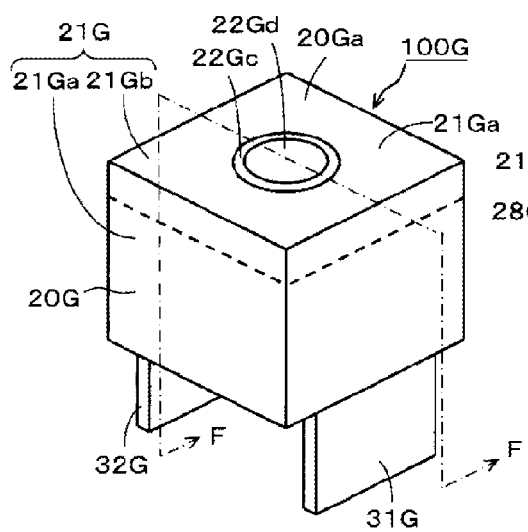
FIGS. 11A and 11B are diagrams for explaining another configuration example of the third embodiment of the capacitive pressure sensing semiconductor device according to the invention.
Figure 11B:
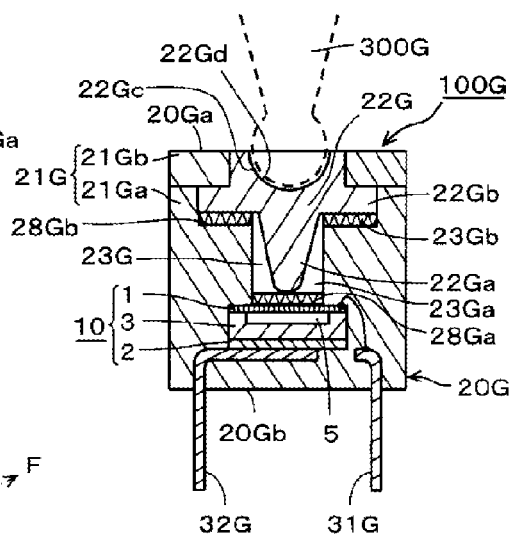

FIGS. 11A and 11B are diagrams for explaining a pressure sensing semiconductor device 100G of a modification example of the third embodiment having such a configuration. FIG. 11A is a perspective view of the pressure sensing semiconductor device 100G of the modification example of the third embodiment. FIG. 11B is a sectional view along line F-F in FIG. 11A. In FIGS. 11A and 11B, the same parts as those of the pressure sensing semiconductor device 100 of the above-described example of FIGS. 1A to 1C are given the same reference symbols. In addition, the parts corresponding to the pressure sensing semiconductor device 100F of FIGS. 10A and 10B are represented by adding suffix G instead of suffix F to the same numerals. Detailed description of these parts is omitted.

Specifically, in this example of FIGS. 11A and 11B, a package member 21G is composed of a main part 21Ga and a lid part 21Gb, and pressure transmitting members (22G, 28Ga, and 28Gb) are housed in a recess 23G thereof similarly to the example of FIGS. 10A and 10B. The pressure transmitting member 22G has a configuration to enable application of pressure so as to bend the first electrode 1 of the pressure detecting chip 10 toward the space 5 via cushion members 28Ga and 28Gb, which separately forms the pressure transmitting member 22G.

In this example of FIGS. 11A and 11B, the structure of the pressure transmitting member, specifically the shape of the pressure transmitting member 22G, is different from the pressure transmitting member in the example of FIGS. 10A and 10B. The other configuration of the pressure sensing semiconductor device 100G is the same as that of the pressure sensing semiconductor device 100F.

Specifically, in this example of FIGS. 11A and 11B, the pressure transmitting member 22G includes a pressing projection 22Ga, a flange part 22Gb, and a pressure-application part 22Gc. As shown in FIG. 11B, the pressing projection 22Ga has a shape with a sharpened tip and the pressure-application part 22Gc has a semispherical recess 22Gd. In this case, the recess 22Gd of the pressure transmitting member 22G and the pressing projection 22Ga are so formed as to be aligned along the pressure application direction perpendicular to the surface of the first electrode 1 of the pressure detecting chip 10.

In this example of FIGS. 11A and 11B, the tip of a pressing member 300G that is opposed to the pressure transmitting member 22G and is formed in a spherical shape, for example, is inserted in the recess 22Gd made in the pressure transmitting member 22G. Due to this feature, even when the direction of pressure application by the pressing member 300G is somewhat different from the pressure application direction perpendicular to the surface of the first electrode 1 of the pressure detecting chip 10, the pressure transmitting member 22G can function such that any difference in the direction can be ignored. Therefore, the pressure applied by the pressing member 300G can be stably and surely transmitted to the first electrode 1 of the pressure detecting chip 10. Based on the pressing force applied by the pressing member 300G, the pressing projection 22Ga presses the first electrode 1 of the pressure detecting chip 10 toward the space 5. Thereby, the first electrode 1 of the pressure detecting chip 10 is bent toward the space 5 and the capacitance Cv changes.

In the pressure sensing semiconductor device 100G of this example of FIGS. 11A and 11B, secure alignment between the pressure transmitting member 22G and the pressing member 300G is achieved by inserting the tip of the pressing member 300G in the recess 22Gd made in the pressure transmitting member 22G. Furthermore, in this example, the shape of the recess 22Gd is set to a semispherical shape and the tip of the pressing member 300G is formed into a spherical shape. Thus, even when the direction of pressure application by the pressing member 300G is somewhat different from the direction perpendicular to the surface of the first electrode 1 of the pressure detecting chip 10, the pressing force by the pressing member 300G is applied to the first electrode 1 of the pressure detecting chip 10 similarly to the case in which the pressing force is applied in the direction perpendicular to the electrode 1.

In the third embodiment shown in FIGS. 10A, 10B, 11A and 11B explained above, a protruding shape including a projection shape, a spherical shape, etc., is employed as the shape of the tip part of the pressure transmitting member to press the first electrode 1 of the pressure detecting chip 10. By forming the tip part of the pressure transmitting member in various protruding shapes in this manner, a desired change characteristic of the capacitance Cv of the pressure detecting chip 10 as a function of pressure applied by the pressing member 300F or the pressing member 300G can be obtained, by selecting either one or both of the tip shape of the pressing projection 22Fa of the pressure transmitting member 22F or the pressing projection 22Ga of the pressure transmitting member 22G and the material of the cushion members 28Fa and 28Fb or the cushion members 28Ga and 28Gb, for example. In the examples above, the tip part of the pressure transmitting member to press the first electrode 1 of the pressure detecting chip 10 has a non-flat-surface shape such as the above-described spherical shape or the shape with a sharpened tip. As other examples of a non-flat-surface shape, a pyramid or circular cone shape that presses the first electrode 1 at a point may be employed, or a curved surface shape having a predetermined curvature may be employed. Furthermore, the tip part of the pressure transmitting member to press the first electrode 1 of the pressure detecting chip 10 may have a shape that presses the first electrode 1 not at a point but over a predetermined area. In addition, the area may non-linearly change corresponding to the pressure applied by the pressing member 300G.

Fourth Embodiment

In the above-described embodiments, the pressure sensing semiconductor device is attached to the printed wiring board such that the surface of the first electrode 1 of the pressure detecting chip 10 of the pressure sensing semiconductor device is parallel to the end surface of the printed wiring board, in order to detect pressure applied along the direction parallel to the surface (board surface) of the printed wiring board on which a printed wiring pattern is formed. In this structure, the pressure sensing semiconductor device needs to be attached to the end surface of the printed wiring board, which may limit flexibility in selecting the attaching position.

A fourth embodiment to be described below is a configuration example of the pressure sensing semiconductor device, which allows the pressure sensing semiconductor device to be disposed at an arbitrary position on the board surface of the printed wiring board in the case in which pressing force is applied along the direction parallel to the board surface of the printed wiring board to the first electrode 1 of the pressure detecting chip 10.

Figure 12A:
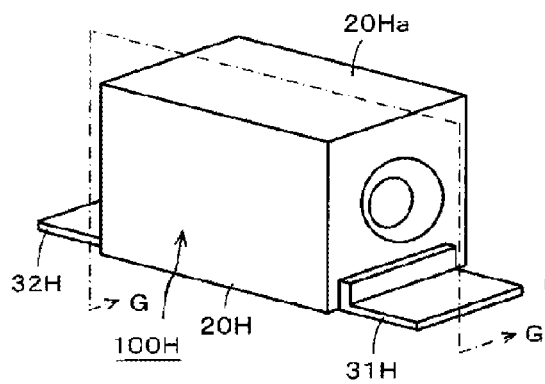
FIGS. 12A and 12B are diagrams for explaining a configuration example of a fourth embodiment of the capacitive pressure sensing semiconductor device according to the invention.
Figure 12B:
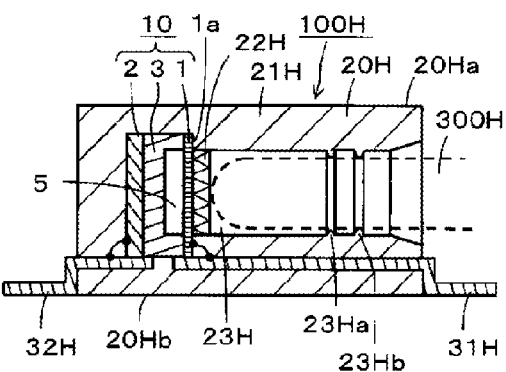

FIGS. 12A and 12B show a configuration example of a pressure sensing semiconductor device 100H of the fourth embodiment. FIG. 12A is a perspective view of the pressure sensing semiconductor device 100H of this example. FIG. 12B is a sectional view along line G-G in FIG. 12A.

As shown in FIG. 12B, in the pressure sensing semiconductor device 100H of the fourth embodiment, the pressure detecting chip 10 is sealed in a package 20H, with the first electrode 1 and the second electrode 2 positioned perpendicularly to a bottom surface 20Hb of the package 20H. A lead terminal 31H connected to the first electrode 1 of the pressure detecting chip 10 is led out as to extend along the direction parallel to the bottom surface 20Hb and flush with the bottom surface 20Hb. A lead terminal 32H connected to the second electrode 2 is also led out to extend along the direction parallel to the bottom surface 20Hb and flush with the bottom surface 20Hb.

A concave hole 23H is made, along the direction parallel to the bottom surface 20Hb of the package 20H, in a package member 21H of the package 20H so as to house the pressure detecting chip 10 inside. The concave hole 23H communicates to the top surface 1a of the first electrode 1 of the pressure detecting chip 10 in the package member 21H. The open side of the concave hole 23H is shaped in a taper part flaring in a trumpet manner and guides a protruding member 300H as the pressing member to facilitate insertion of the protruding member 300H.

A cushion member 22H that forms a pressure transmitting member and is composed of, for example, silicone rubber is provided on the side of the top surface 1a of the first electrode 1 of the pressure detecting chip 10. Projections 23Ha and 23Hb in the form of an O-ring are formed on the inner wall surface of the concave hole 23H. The inner diameter of the concave hole 23H is set almost equal to or slightly larger than the diameter of the abutting part of the protruding member 300H (shown by the dashed line in the diagram), which applies pressure to the pressure sensing semiconductor device 100H of this example from the external. The inner diameter of the projections 23Ha and 23Hb in the form of an O-ring is selected to be slightly smaller than the diameter of the abutting part of the protruding member 300H (shown by the dashed line in the diagram).

Therefore, it is possible to insert the protruding member 300H in the concave hole 23H and make the tip of the protruding member 300H abut against the top surface 1a of the first electrode 1 of the pressure detecting chip 10 with the intermediary of the cushion member 22H. Due to this feature, when pressing force is applied to the protruding member 300H inserted in the concave hole 23H along the direction parallel to a top surface 20Ha or the bottom surface 20Hb of the package 20H, the first electrode 1 of the pressure detecting chip 10 is bent toward the space 5 and the capacitance Cv of the pressure detecting chip 10 changes.

At this time, according to the fourth embodiment, the protruding member 300H is held by the projections 23Ha and 23Hb in the form of an O-ring in the concave hole 23H. Furthermore, the pressure corresponding to pressing force applied by the protruding member 300H is surely transmitted to the first electrode 1 of the pressure detecting chip 10 via the cushion member 22H.

Although the cushion member 22H is provided as the pressure transmitting member in the example of FIGS. 12A and 12B, it is also possible to employ a configuration, in which an elastic member is disposed in front of the first electrode 1 of the pressure detecting chip 10 inside the concave hole 23H, as in the example of FIGS. 1A to 1C. It is also possible to employ a configuration, in which the package member 21H is formed of a material having elasticity to allow the package member itself to function as the pressure transmitting member, as in the second embodiment.

In this example of FIGS. 12A and 12B, a desired change characteristic of the capacitance Cv of the pressure detecting chip 10 as a function of pressure applied by the protruding member 300H can be obtained by selectively determining either one or both of the shape of the tip part of the protruding member 300H inserted in the concave hole 23H and the material for the cushion member 22H.

Fifth Embodiment

This fifth embodiment is also an example of the pressure sensing semiconductor device, in which the capacitance Cv of the pressure detecting chip 10 changes depending on pressure applied by a protruding member along the direction parallel to the board surface of the printed wiring board when the pressure sensing semiconductor device is attached to the printed wiring board similarly to the fourth embodiment.

Figure 13A:
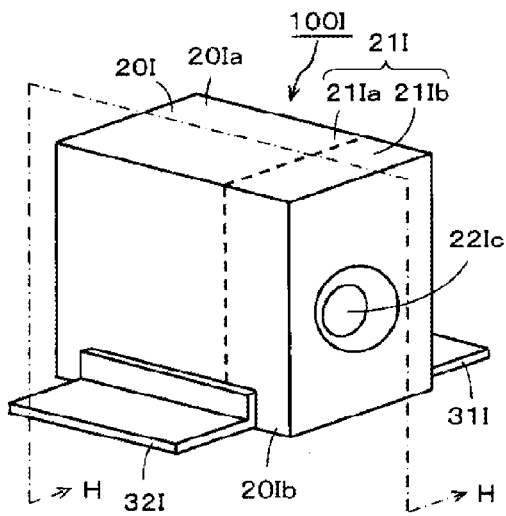
FIGS. 13A and 13B are diagrams for explaining a configuration example of a fifth embodiment of the capacitive pressure sensing semiconductor device according to the invention.
Figure 13B:
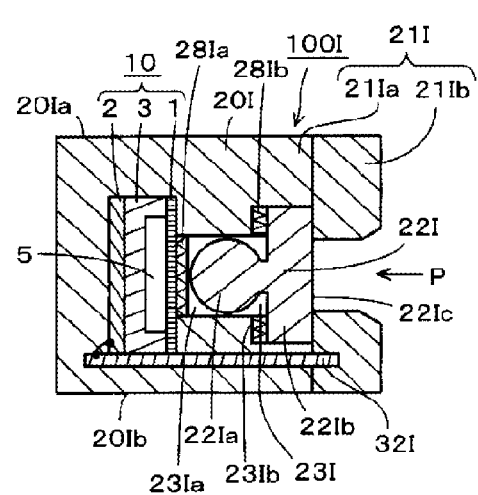

FIGS. 13A and 13B show a configuration example of a pressure sensing semiconductor device 100I of the fifth embodiment. FIG. 13A is a perspective view of the pressure sensing semiconductor device 100I. FIG. 13B is a sectional view along line H-H in FIG. 13A.

As shown in FIG. 13B, the pressure sensing semiconductor device 100I of the fifth embodiment is almost equal to an example of the pressure sensing semiconductor device 100F of the third embodiment shown in FIGS. 10A and 10B, except that its side surfaces are oriented as the top surface and the bottom surface and a different method of leading out lead terminals is used. The shape of the pressure transmitting member is very similar. Thus, in FIGS. 13A and 13B, the parts corresponding to the pressure sensing semiconductor device 100F of the example of FIGS. 10A and 10B are represented by adding suffix I instead of suffix F to the same reference numerals.

Specifically, as shown in FIG. 13B, in the pressure sensing semiconductor device 100I of the fifth embodiment, the pressure detecting chip 10 is sealed in a package 20I, with the first electrode 1 and the second electrode 2 positioned perpendicularly to a bottom surface 20Ib of the package 20I. A lead terminal 31I connected to the first electrode 1 of the pressure detecting chip 10 is led out to be flush with the bottom surface 20Ib. The lead terminal 31I extends away from the package 20 in a direction that is parallel to the bottom surface 20Ib and that is orthogonal to the direction in which the pressure P is applied by the protruding member (not shown). A lead terminal 32I connected to the second electrode 2 is also led out to extend along the direction parallel to the bottom surface 20Ib flush with the bottom surface 20Ib.

As shown in FIGS. 13A and 13B, in the pressure sensing semiconductor device 100I of the fifth embodiment, the package 20I is composed of a package member 21I and a pressure transmitting member 22I. The pressure transmitting member 22I is housed in a recess 23I in the package member 21I. In this case, the pressure transmitting member 22I is mounted in a main part 21Ia of the package member 21I in such a manner that a pressing projection 22Ia of the pressure transmitting member 22I is inserted in a concave hole 23Ia, and a flange part 22Ib of the pressure transmitting member 22I is made to abut against a step part 23Ib made in the main part 21Ia of the package member 21I with the intermediary of a cushion member 28Ib. In this example, a taper part is so formed as to flare in a trumpet manner on the open side of the recess 23I of the package member 21I. In addition, on the open side, a pressure-application part 22Ic of the pressure transmitting member 22I is exposed at the bottom part of the taper part. That is, the taper part made in a lid part 21Ib that forms the package member 21I, and the exposed surface of the pressure-application part 22Ic of the pressure transmitting member 22I, together define a recess. By guiding the tip of the protruding member by the recess and making the tip abut against the pressure-application part 22Ic of the pressure transmitting member 22I, the protruding member is readily coupled to the pressure detecting chip 10 and pressure can be surely transmitted. In the case of this example, the pressing projection 22Ia of the pressure transmitting member 22I presses the first electrode 1 of the pressure detecting chip 10 toward the space 5 via a cushion member 28Ia.

According to the fifth embodiment of this example of FIGS. 13A and 13B, pressure applied along the direction parallel to a top surface 20Ia or the bottom surface 20Ib of the package 20I can be detected by the pressure sensing semiconductor device 100I similarly to the fourth embodiment. Furthermore, in the fifth embodiment, the same effects as those achieved by the above-described third embodiment can be obtained.

A spherical shape is shown in FIG. 13B as the shape of the tip part of the pressure transmitting member 22I in the fifth embodiment for pressing the first electrode 1 of the pressure detecting chip 10. However, various non-flat-surface shapes can be employed similarly to the above-described third embodiment. Furthermore, in the fifth embodiment also, a desired change characteristic of the capacitance Cv of the pressure detecting chip 10 as a function of pressure applied by the protruding member can be obtained by selectively determining either one or both of the shape of the tip part of the pressure transmitting member 22I for pressing the first electrode 1 of the pressure detecting chip 10, i.e., the tip shape of the pressing projection 22Ia, and the material for the cushion members 28Ia and 28Ib.

Sixth Embodiment

This sixth embodiment is also an example of the case of a pressure sensing semiconductor device 100J that changes the capacitance Cv of the pressure detecting chip 10 in correspondence to pressing force applied along the direction parallel to the top surface or the bottom surface of the package similarly to the fourth and fifth embodiments.

FIGS. 14A and 14B show a configuration example of the pressure sensing semiconductor device 100J of the sixth embodiment. FIG. 14A is a perspective view of the pressure sensing semiconductor device 100J. FIG. 14B is a sectional view along line I-I in FIG. 14A.

As shown in FIGS. 14A and 14B, in the pressure sensing semiconductor device 100J of the sixth embodiment, a package 20J is composed of a package member 21J and a pressure transmitting member 22J. The package member 21J is composed of a main part 21Ja and a lid part 21Jb. As shown in FIG. 14B, the main part 21Ja of the package member 21J has a recess 23J that extends upwardly and then bends in a key shape, above the first electrode 1 of the pressure detecting chip 10, in a direction parallel to a bottom surface 20Jb of the package 20J.

In this example, a cushion member 28Ja is formed to adhere onto the first electrode 1 of the pressure detecting chip 10. The cushion member 28Ja protects the first electrode 1 so that the first electrode 1 is not damaged by the direct contact of the pressure transmitting member 22J with the first electrode 1. In addition, the cushion member 28Ja plays a role of elastically transmitting pressure applied via the pressure transmitting member 22J. The cushion member 28Ja is formed of, for example, silicone rubber. The modulus of elasticity of the cushion member 28Ja is selected depending on the desired change characteristic of the capacitance Cv of the pressure detecting chip 10 as a function of the applied pressure P by the pressing member.

The pressure transmitting member 22J has a pressing projection 22Ja that abuts against the first electrode 1 of the pressure detecting chip 10 with the intermediary of the cushion member 28Ja, a flange part 22Jb, and a pressure-application part 22Jc that is exposed to the outside of the package 20J and receives pressure by the pressing member. In this example, the pressing projection 22Ja is formed in a semispherical shape. A cushion member 28Th is formed to adhere to the surface of the flange part 22Jb on the side of the pressing projection 22Ja. In this example, additionally, a recess 22Jd that receives the tip of the pressing member is formed in the pressure transmitting member 22J.

As shown in FIG. 14B, the recess 23J of the main part 21Ja of the package member 21J has a concave hole 23Ja, in which the pressing projection 22Ja of the pressure transmitting member 22J is freely movable, and a step part 23Jb with which the flange part 22Jb of the pressure transmitting member 22J engages with the intermediary of the cushion member 28Th.

In the pressure sensing semiconductor device 100J of the sixth embodiment, the pressure transmitting member 22J is mounted in the main part 21Ja of the package member 21J in such a manner that the pressing projection 22Ja of the pressure transmitting member 22J is inserted in the recess 23J in the main part 21Ja of the package member 21J, in which the pressure detecting chip 10 is housed, and the flange part 22Jb of the pressure transmitting member 22J is made to abut against the step part 23Jb made in the main part 21Ja of the package member 21J with the intermediary of the cushion member 28Th.

In this state, the package 20J is sealed by the lid part 21Jb of the package member 21J, with the pressure-application part 22Jc of the pressure transmitting member 22J being exposed from the package 20J.

As shown in FIG. 14B, in the pressure sensing semiconductor device 100J of the sixth embodiment, the pressure detecting chip 10 is sealed in the package 20J with the first electrode 1 and the second electrode 2 positioned in parallel to a top surface 20Ja or the bottom surface 20Jb of the package 20J. A lead terminal 31J connected to the first electrode 1 of the pressure detecting chip 10 is led out to extend along the direction, which is parallel to the bottom surface 20Th and along which the pressure P is applied by the pressing member, and the lead terminal 31J is flush with the bottom surface 20Jb. A lead terminal 32J connected to the second electrode 2 is also led out to extend along the direction, which is parallel to the bottom surface 20Jb and along which the pressure P is applied by the pressing member, and the lead terminal 32J is flush with the bottom surface 20Jb.

As described above, the recess 23J is formed as a guide hole for the pressure transmitting member 22J, with its shape bending into a key shape above the first electrode 1 and including an inclined wall 23Jc at the bent part of the key shape. Furthermore, the pressure transmitting member 22J having a key shape corresponding to the internal shape of the recess 23J is loosely fitted into the recess 23J in such a manner that the pressure transmitting member 22J can change its position in the direction along which the pressure P is applied by the pressing member.

The pressing projection 22Ja of the pressure transmitting member 22J has an inclined surface 22Jc that abuts against the inclined wall 23Jc of the recess 23J. The pressure sensing semiconductor device 100J of the sixth embodiment has the above-described structure. Therefore, when the pressure transmitting member 22J receives the pressure P by the pressing member along the direction shown by the arrow in FIG. 14B, the pressure transmitting member 22J is displaced in the direction in which the pressure P is applied due to the existence of the cushion member 28Jb. Thereupon, the pressure transmitting member 22J is displaced in a direction so as to press the first electrode 1 of the pressure detecting chip 10 due to the inclined surface 22Je of the pressing projection 22Ja of the pressure transmitting member 22J abutting against the inclined wall 23Jc of the recess 23J. Therefore, the first electrode 1 of the pressure detecting chip 10 bends in correspondence to the pressing force due to the displacement of the pressure transmitting member 22J, to thereby cause the capacitance Cv of the pressure detecting chip 10 to change.

Also in the pressure sensing semiconductor device 100J of the sixth embodiment, a desired change characteristic of the capacitance Cv of the pressure detecting chip 10 as a function of the pressure P applied by the pressing member can be obtained by selectively determining the material for the cushion members 28Ja and 28Th and/or the elastic constant of elasticity of the pressure transmitting member 22J. Furthermore, even when excessive pressure P is applied to the pressure detecting chip 10, the pressure detecting chip 10 is protected from damage because the cushion members 28Ja and 28Th having predetermined elasticity are disposed. Thus, the package 20J and the pressure transmitting member 22J can be formed of a resin material having relatively greater hardness, such as plastic or ceramic. Therefore, without the elastic deformation of the inclined wall 23Jc in the recess 23J and the inclined surface 22Je of the pressure transmitting member 22J against each other, the pressure P applied in the direction along the electrode surface of the pressure detecting chip 10 can be converted to pressure along the direction perpendicular to the electrode surface of the pressure detecting chip 10 without significant transmission loss.

Seventh Embodiment

The seventh embodiment is also an example of the pressure sensing semiconductor device that is so configured to detect pressing force applied along the direction parallel to the top surface or the bottom surface of the package when the pressure sensing semiconductor device is attached to the board surface of the printed wiring board.

FIG. 15 shows a configuration example of a pressure sensing semiconductor device 100K of the seventh embodiment. FIG. 15A is a perspective view of the pressure sensing semiconductor device 100K. FIG. 15B is a sectional view along line J-J in FIG. 15A.

The seventh embodiment is a modification example of the sixth embodiment. Specifically, in the seventh embodiment, the pressure detecting chip 10 is sealed in a package 20K, with the first electrode 1 and the second electrode 2 disposed relative to each other along a direction vertical to a top surface 20Ka or a bottom surface 20Kb of the package 20K. A lead terminal 31K connected to the first electrode 1 of the pressure detecting chip 10 is led out to extend along the direction, which is parallel to the bottom surface 20Kb and along which the pressure P is applied by the pressing member, and the lead terminal 31K is flush with the bottom surface 20Kb. A lead terminal 32K connected to the second electrode 2 is also led out to extend along the direction, which is parallel to the bottom surface 20Kb and along which the pressure P is applied by the pressing member, and the lead terminal 32K is flush with the bottom surface 20Kb.

As shown in FIGS. 15A and 15B, in the pressure sensing semiconductor device 100K of the seventh embodiment, a package member 21K forming the package 20K is composed of a main part 21Ka and a lid part 21Kb. Inside the package member 21K, a recess 23K is formed, which has a shape that bends in a key shape above the first electrode 1 of the pressure detecting chip 10.

In the seventh embodiment, fluid material (or a fluent body) 29 is filled in the recess 23K and the recess 23K is sealed by a sealing valve 22Ka so that leakage of the fluid material 29 is prevented. However, the sealing valve 22Ka is displaceable (movable), as described later.

In the seventh embodiment, a valve pressing part 22Kb presses the sealing valve 22Ka in such a direction as to press the fluid material 29 via a cushion member 28Ka engaged with a step part 23Kb made in the main part 21Ka of the package member 21K. The valve pressing part 22Kb has a recess 22Kd, which receives the tip of the pressing member to apply the pressing force P along the lateral direction shown by the arrow in FIG. 15B.

The pressure sensing semiconductor device 100K of the seventh embodiment has the above-described structure. Therefore, when the valve pressing part 22Kb receives the pressing force P along the direction shown by the arrow in FIG. 15B, the valve pressing part 22Kb is displaced in the direction along which the pressing force P is applied due to the existence of the cushion member 28Ka. In response to this, the sealing valve 22Ka is displaced in a direction so as to press the fluid material 29.

Thereupon, the pressing force P transmitted to the fluid material 29 is transmitted to the first electrode 1 of the pressure detecting chip 10 and the first electrode 1 of the pressure detecting chip 10 bends in correspondence to the pressing force P. Thereby, the capacitance Cv of the pressure detecting chip 10 changes.

Thus, in the pressure sensing semiconductor device 100K of the seventh embodiment, the pressure transmitting member is configured by the fluid material 29, the sealing valve 22Ka, the valve pressing part 22Kb, and the cushion member 28Ka.

In this case, as compared to a cross-section area Sa of the recess 23K toward the sealing valve 22Ka, a cross-section area Sb of the recess 28K toward the first electrode 1 of the pressure detecting chip 10 is made smaller. Therefore, the pressure applied to the occlusion valve 22Ka is transmitted as a large force onto the first electrode 1 of the pressure detecting chip 10. This allows the pressing force P to be transmitted onto the first electrode 1 of the pressure detecting chip 10 with high efficiency.

In the pressure sensing semiconductor device 100K of the seventh embodiment, the material for forming the cushion member 28Ka and the material for the fluid material 29 are so selected that a desired change characteristic of the capacitance Cv of the pressure detecting chip 10 as a function of the pressing force P is obtained. As the fluid material 29, either a liquid or a gas may be employed. In short, any material may be employed as long as it can transmit the pressure P applied by the pressing member.

Application Examples of Semiconductor Device

The above-described pressure sensing semiconductor devices of the invention can be applied to an electronic device, which achieves various functions and purposes based on capacitance measured in a circuit that varies depending on applied pressure.

Figure 16:
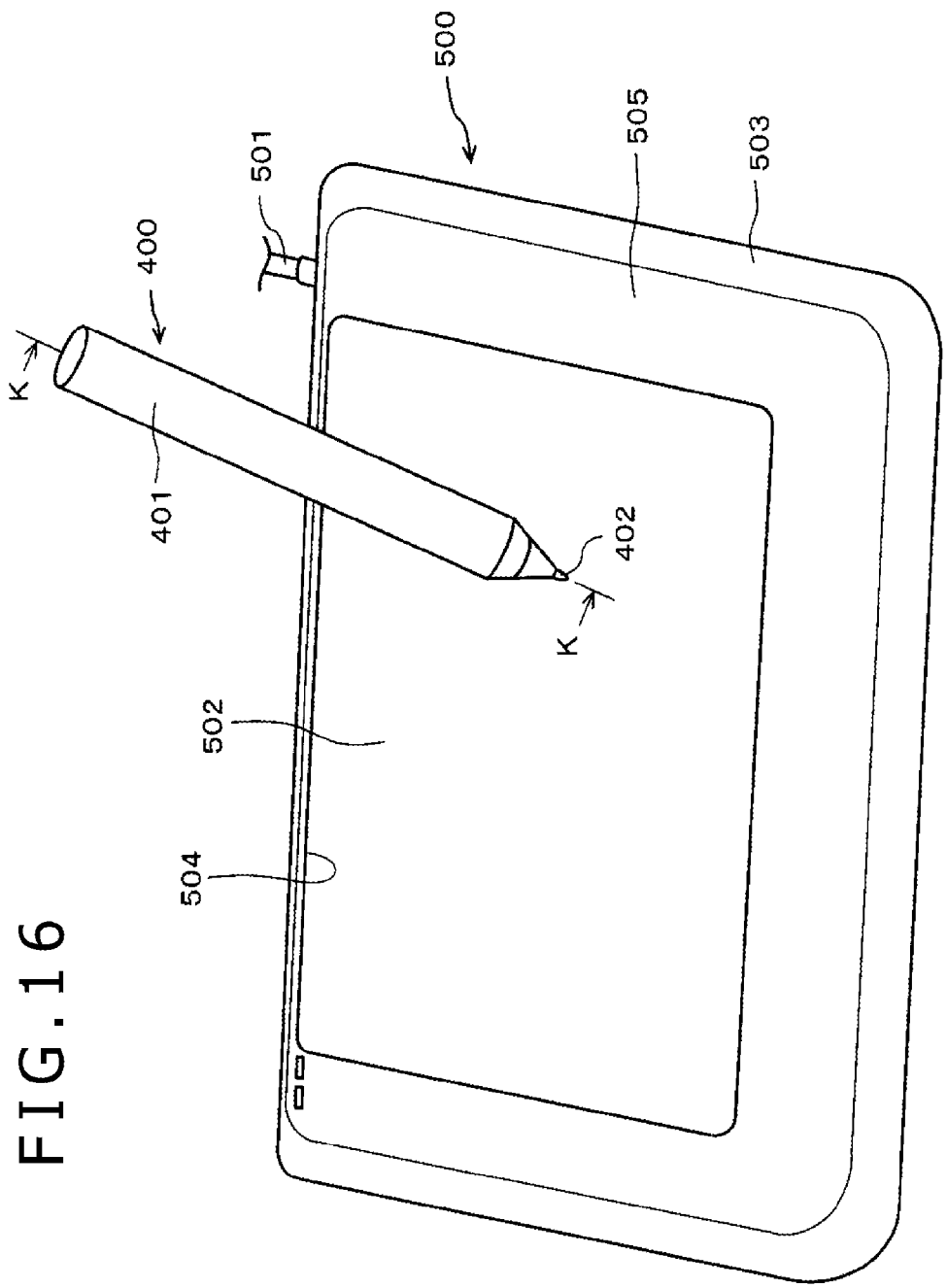
FIG. 16 is a diagram for explaining a position detecting device to which an embodiment of the capacitive pressure sensing semiconductor device according to the invention is applied.

An application example to be described below is one example of the electronic device, and is an example of the case in which the pressure sensing semiconductor device is used in a position indicator capable of detecting writing pressure, which is used together with a position detecting device described at the beginning of the present application. This application example will be described below. FIG. 16 is a diagram showing an outer configuration example of a position indicator 400, in which the pressure sensing semiconductor device of an embodiment of the invention is used, and a position detecting device 500.

The position detecting device 500 is connected to an external device such as a personal computer or portable apparatus (not shown) via a cable 501, to thereby be used as an input device for the external device. Alternatively, the position detecting device 500 may be a device that has a display section and thus can be operated without being connected to an external device.

The position detecting device 500 of this example is configured of a detection part 502, which detects a position indicated by the position indicator 400 based on an electromagnetic induction system, and a hollow, thin, and rectangular parallelepiped chassis 503 that receives the detection part 502. The chassis 503 has an upper chassis 505 having an opening 504 for exposing the detection surface of the detection part 502 and a lower chassis (not shown) overlapped with the upper chassis 505. The upper chassis 505 has the rectangular opening 504 for exposing the input surface of the detection part 502, and the detection part 502 is fitted into the opening 504. With the position detecting device 500 having such a configuration, input of characters, figures, etc., by pointing operation of the position indicator 400 is performed. If the position detecting device 500 has a display section, displaying in association with pointing operation by the position indicator 400 can be performed on the display section.

Figure 17:
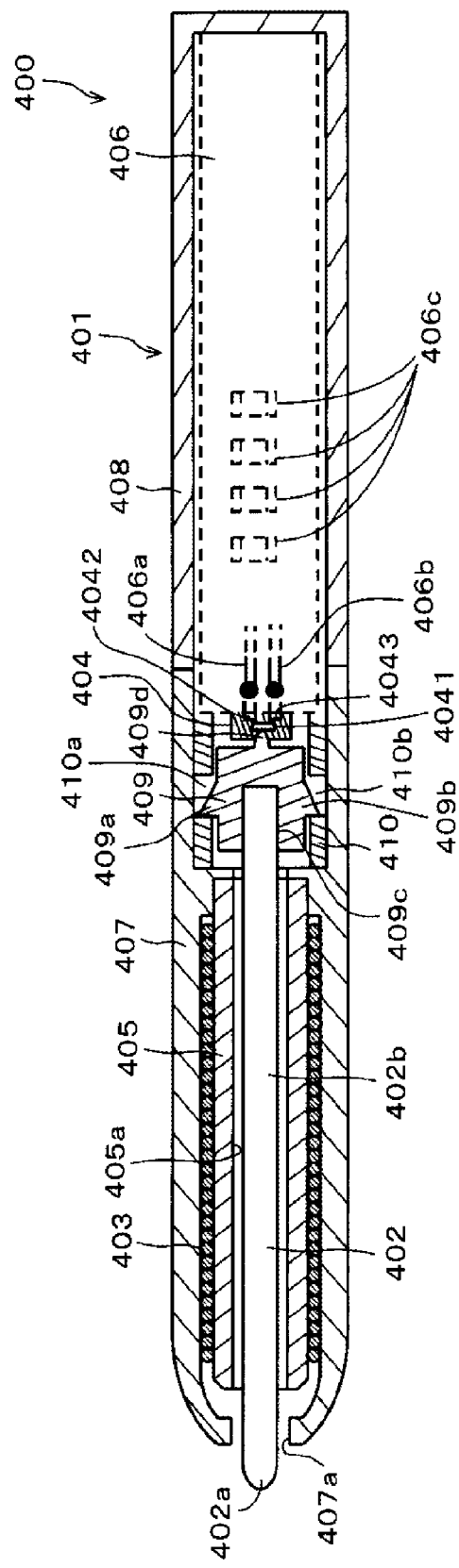
FIG. 17 is a diagram for explaining a position indicator to which an embodiment of the capacitive pressure sensing semiconductor device according to the invention is applied.

Next, a configuration example of the position indicator 400 will be described with reference to FIG. 17. FIG. 17 is a sectional view of the position indicator 400 along line K-K in FIG. 16.

The position indicator 400 is configured to indicate a position to the position detecting device 500 based on the electromagnetic induction system. Specifically, the position indicator 400 has a resonant circuit that resonates in response to electromagnetic waves in a specific frequency transmitted from the position detecting device 500. The position indicator 400 transmits the resonance signal detected by the resonant circuit to the position detecting device 500 to thereby indicate a position to the position detecting device 500.

As shown in FIG. 17, the position indicator 400 includes a case 401 representing one specific example of the chassis, a core body 402, a position indication coil 403, a pressure sensing semiconductor device 404 forming a capacitance-variable capacitor, a ferrite core 405, and a printed wiring board 406. The resonant circuit is configured by the position indication coil 403, the capacitance-variable capacitor Cv of the pressure sensing semiconductor device 404, and plural capacitance-fixed capacitors 406c that are connected in parallel to the capacitance-variable capacitor Cv and are collectively represented as a capacitance Cf. The number (capacitance) of capacitance-fixed capacitors 406c is selected depending on the resonant frequency of the resonant circuit.

The case 401 is formed as an exterior cover for the position indicator 400. The case 401 has a bottomed cylindrical shape with one closed end. Furthermore, the case 401 is composed of a first case 407 and a second case 408 that are so assembled and connected as to be adjacent to each other along the axis direction. One end side of the first case 407 in the axis direction has a substantially circular cone shape and has an opening 407a at its tip. The other end of the first case 407 in the axis direction is open.

The second case 408 has a cylindrical shape in which one end in the axis direction is open and the other end is closed. The first case 407 and the second case 408 are disposed on the same axis line and are engaged with each other by an adhesive or the like. In the second case 408, the printed wiring board 406 on which electronic parts are mounted is housed and fixed by an adhesive or the like. In the first case 407, the ferrite core 405 is housed and fixed.

The ferrite core 405 has, for example, a cylindrical shape and the core body 402 is inserted in a tubular hole 405a thereof. An indication part 402a of the core body 402 protrudes from one end side of the ferrite core 405 in the axis direction. Furthermore, the position indication coil 403 forming the resonant circuit is wound and mounted around the outer circumference of the ferrite core 405. Both ends (not shown) of the position indication coil 403 are electrically connected to the electronic parts on the printed wiring board 406.

In this example, the pressure sensing semiconductor device 100D of the embodiment shown in the above-described FIGS. 8A and 8B is used as the pressure sensing semiconductor device 404.

Specifically, in the example of FIG. 17, the pressure sensing semiconductor device 404 including a built-in pressure detecting chip 4041 is attached to the end part of the printed wiring board 406, which is located adjacent to the core body 402, in the manner shown in FIGS. 8A and 8B. More specifically, as shown in FIG. 17, the pressure sensing semiconductor device 404 has lead terminals 4042 and 4043 having a shape corresponding to the lead terminals 31D and 32D shown in FIGS. 8A and 8B. Furthermore, the pressure sensing semiconductor device 404 is attached to the printed wiring board 406 in such a manner that the respective surfaces of the printed wiring board 406 are sandwiched between the lead terminals 4042 and 4043 on one surface and a dummy terminal (not shown) on the other surface at the end part of the printed wiring board 406. The bottom surface (20b in FIG. 8A0 of the package of the pressure sensing semiconductor device 404 is pressed against the end surface of the printed wiring board 406.

The lead terminals 4042 and 4043 are soldered to conductor patterns 406a and 406b, respectively, formed on the printed wiring board 406. Furthermore, the above-described plural capacitance-fixed capacitors 406c are provided on the printed wiring board 406. These plural capacitors 406c are connected in parallel between the conductor patterns 406a and 406b. The conductor patterns 406a and 406b are electrically connected to two ends of the position indication coil 403, respectively, although not shown in the diagram. Thus, the pressure sensing semiconductor device 404 is fixedly attached to the printed wiring board 406 in such a manner that the pressure sensing semiconductor device 404 receives pressing force along the axis direction of the case 401 from the core body 402 to thereby change the capacitance Cv of the pressure detecting chip 4041.

The core body 402 is formed of a rod-shape member and is housed in the case 401 along the axis direction of the case 401. The core body 402 is composed of the indication part 402a that functions as the pen tip at one end in the axis direction of the core body 402 and a shaft part 402b that is continuously formed from the indication part 402a. The indication part 402a is formed in a substantially circular cone shape. The indication part 402a protrudes from the opening 407a of the first case 407 toward the outside when the core body 402 is housed in the case 401.

The other end side of the core body 402 opposite from the indication part 402a is fitted into a pressing body 409. Specifically, the pressing body 409 has a circular columnar shape and has a fitting concave hole 409c into which the proximal end of the core body 402 is fitted along the axis direction of the core body 402. On the circumferential part of the pressing body 409, projections 409a and 409b are formed, which are respectively received in notch parts 410a and 410b that are formed in the side surface of a holder 410 and that have a predetermined length along the axis direction of the case 401. The pressing body 409 is housed in the cylindrical holder 410 fixed to the first case 407, but the pressing body 409 is movable along the axis direction of the core body 402 due to the movable engagement between the projections 409a and 409b and the notch parts 410a and 410b. Therefore, the pressing body 409 can move along the axis direction of the case 401 in the range of the length of the notch parts 410a and 410b of the holder 410, with the projections 409a and 409b inserted in the notch parts 410a and 410b.

The pressing body 409 is further provided with a projection 409d that is inserted in a concave hole (see the concave hole 23 in FIG. 8B) of the pressure sensing semiconductor device 404 to press the first electrode 1 of the pressure detecting chip 4041 toward the space 5.

The position indicator 400 is configured in the above-described manner. Thus, when the user holding the position indicator 400 in the user's hand brings the position indicator 400 into contact with the detection part 502 of the position detecting device 500 and presses the detection part 502 with the position indicator 400, the core body 402 is displaced along the axis direction of the case 401 such that the projection 409d of the pressing body 409 presses the first electrode 1 of the pressure detecting chip 4041 of the pressure sensing semiconductor device 404 toward the space 5. Therefore, the pressing force corresponding to the writing pressure applied to the core body 402 is applied to the first electrode 1 of the pressure detecting chip 4041 of the pressure sensing semiconductor device 404, and the capacitance Cv of the pressure detecting chip 4041 changes in correspondence to the writing pressure.

The capacitance change changes the resonant frequency of the resonant circuit of the position indicator 400. The position detecting device 500 detects this change in the resonant frequency of the resonant circuit of the position indicator 400 to detect the writing pressure applied to the position indicator 400 in a manner described below.

Circuit Configuration for Position Detection and Writing Pressure Detection in Position Detecting Device 500

Figure 18:
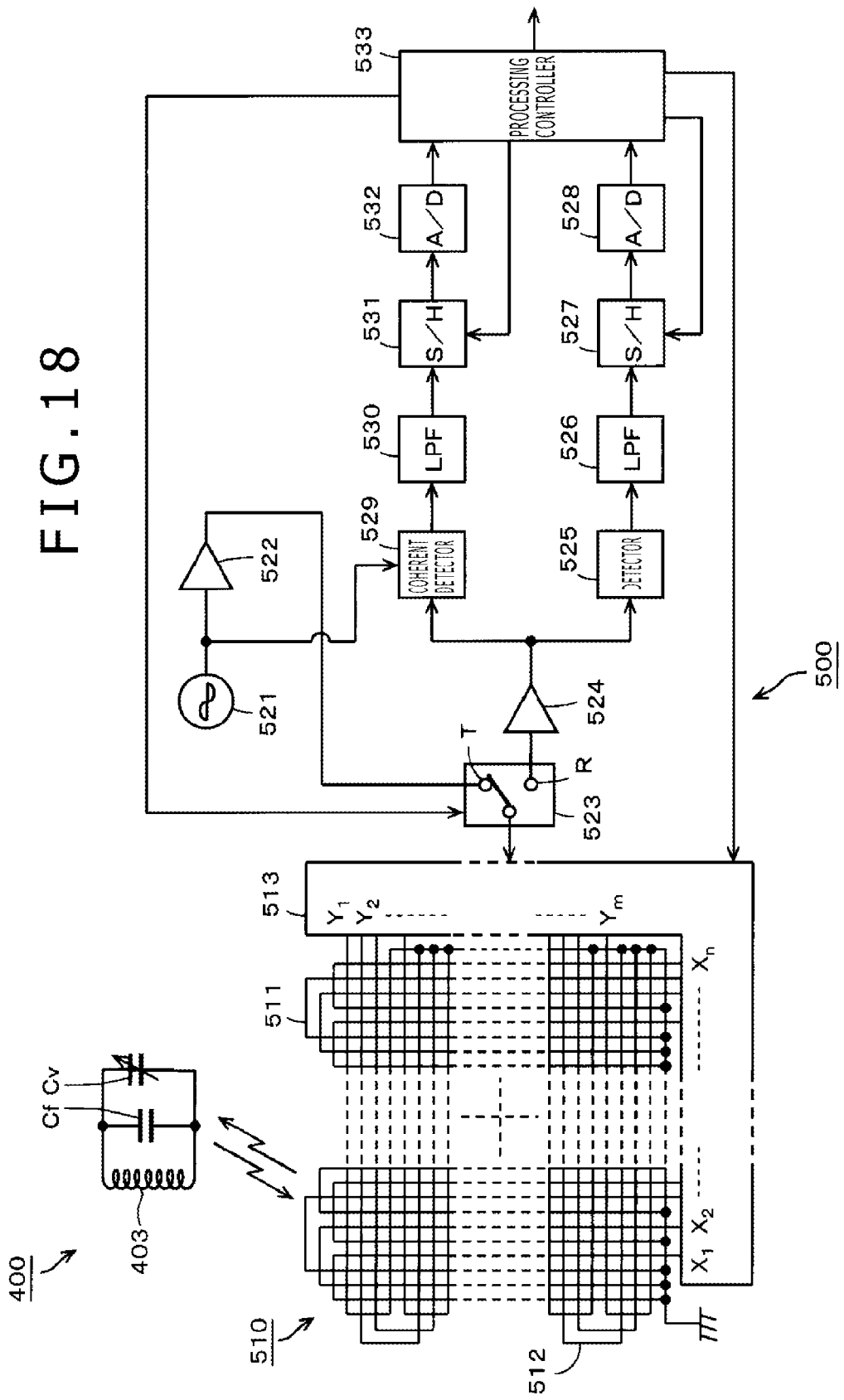
FIG. 18 is a circuit diagram of one example of a position detection and writing pressure detection circuit of the position detecting device, to which an embodiment of the capacitive pressure sensing semiconductor device according to the invention is applied.

Next, a circuit configuration example for the position detecting device 500 to detect the indicated position and the writing pressure by using the position indicator 400 of the above-described embodiment will be described below with reference to FIG. 18. FIG. 18 is a block diagram showing the circuit configuration example of the position indicator 400 and the position detecting device 500.

The position indicator 400 has, as the circuit configuration, a resonant circuit obtained by connecting the position indication coil 403, the variable capacitance Cv formed by the pressure detecting chip 4041, and fixed capacitance Cf composed of the plural capacitance-fixed capacitors 406c in parallel.

In the position detecting device 500, a position detection coil 510 is formed by stacking an X-axis-direction loop coil group 511 and a Y-axis-direction loop coil group 512. The respective loop coil groups 511 and 512 are formed of n and m rectangular loop coils, for example, respectively. The respective loop coils forming the respective loop coil groups 511 and 512 are disposed at equal intervals and sequentially overlap with each other.

Furthermore, in the position detecting device 500, a selection circuit 513 is provided, to which the X-axis-direction loop coil group 511 and the Y-axis-direction loop coil group 512 are connected. The selection circuit 513 sequentially selects one loop coil in the two loop coil groups 511 and 512.

Moreover, the following units are provided in the position detecting device 500: an oscillator 521, a current driver 522, a switch connection circuit 523, a receiving amplifier 524, a detector 525, a low-pass filter 526, a sample/hold circuit 527, an A/D conversion circuit 528, a coherent detector 529, a low-pass filter 530, a sample/hold circuit 531, an A/D conversion circuit 532, and a processing controller 533.

The oscillator 521 generates an AC signal in a frequency f0. The oscillator 521 supplies the generated AC signal to the current driver 522 and the coherent detector 529. The current driver 522 converts the AC signal supplied from the oscillator 521 to a current and sends it to the switch connection circuit 523. The switch connection circuit 523 switches the connection target (a transmission-side terminal T or a reception-side terminal R), to which the loop coil selected by the selection circuit 513 is connected under control from the processing controller 533 to be described later. Of the connection targets, the transmission-side terminal T is connected to the current driver 522, and the reception-side terminal R is connected to the receiving amplifier 524.

An induced voltage generated in the loop coil selected by the selection circuit 513 is sent to the receiving amplifier 524 via the selection circuit 513 and the switch connection circuit 523. The receiving amplifier 524 amplifies the induced voltage supplied from the loop coil and sends the amplified voltage to the detector 525 and the coherent detector 529.

The detector 525 detects the induced voltage generated in the loop coil, i.e., a reception signal, and sends it to the low-pass filter 526. The low-pass filter 526 has a cutoff frequency sufficiently lower than the above-described frequency f0. It converts the output signal of the detector 525 to a direct current (DC) signal and sends it to the sample/hold circuit 527. The sample/hold circuit 527 holds a voltage value at a predetermined timing of the signal output from the low-pass filter 526, specifically at the predetermined timing in the reception period, and sends the voltage value to the A/D (analog to digital) conversion circuit 528. The A/D conversion circuit 528 converts the analog output of the sample/hold circuit 527 to a digital signal and outputs the digital signal to the processing controller 533.

The coherent detector 529 performs coherent detection of the output signal of the receiving amplifier 524 with an alternating current (AC) signal from the oscillator 521 and sends out a signal having the level depending on the phase difference between them to the low-pass filter 530. The low-pass filter 530 has a cutoff frequency sufficiently lower than the frequency f0. It converts the output signal of the coherent detector 529 to a DC signal and sends it to the sample/hold circuit 531. The sample/hold circuit 531 holds a voltage value at a predetermined timing of the signal output from the low-pass filter 530 and sends it to the A/D (analog to digital) conversion circuit 532. The A/D conversion circuit 532 converts the analog output of the sample/hold circuit 531 to a digital signal and outputs the digital signal to the processing controller 533.

The processing controller 533 controls the respective units of the position detecting device 500. Specifically, the processing controller 533 controls selection of the loop coil in the selection circuit 513, switching of the switch connection circuit 523, and the timing of the sample/hold circuits 527 and 531. Based on the input signals from the A/D conversion circuits 528 and 532, the processing controller 533 causes the X-axis-direction loop coil group 511 and the Y-axis-direction loop coil group 512 to transmit electromagnetic waves for a determined transmission continuation time.

An induced voltage is generated in the respective loop coils of the X-axis-direction loop coil group 511 and the Y-axis-direction loop coil group 512 based on electromagnetic waves transmitted from the position indicator 400. The processing controller 533 calculates the coordinate values of the position indicated by the position indicator 400 along the X-axis direction and the Y-axis direction based on the level of the voltage value of the induced voltage generated in the respective loop coils. Furthermore, the processing controller 533 detects the writing pressure based on the level of the signal depending on the phase difference between the transmitted electromagnetic waves and the received electromagnetic waves.

In this manner, the position detecting device 500 can detect the position of the position indicator 400, which has come close to the position detecting device 500, based on the processing controller 533. In addition, the position detecting device 500 can obtain information on the writing pressure value of the position indicator 400 by detecting the phase of the received signal.

Other Embodiments or Modification Examples

Figure 19A:
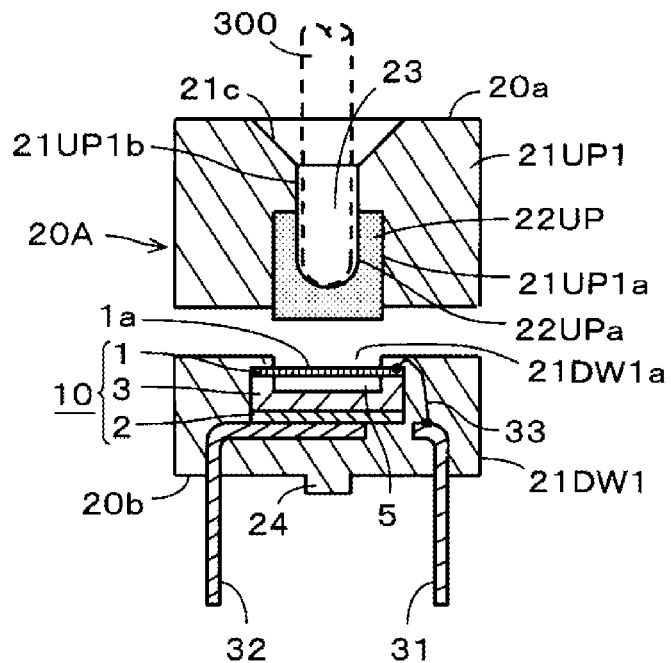
FIGS. 19A and 19B are diagrams for explaining modification examples of the capacitive pressure sensing semiconductor device according to the invention.
Figure 19B:
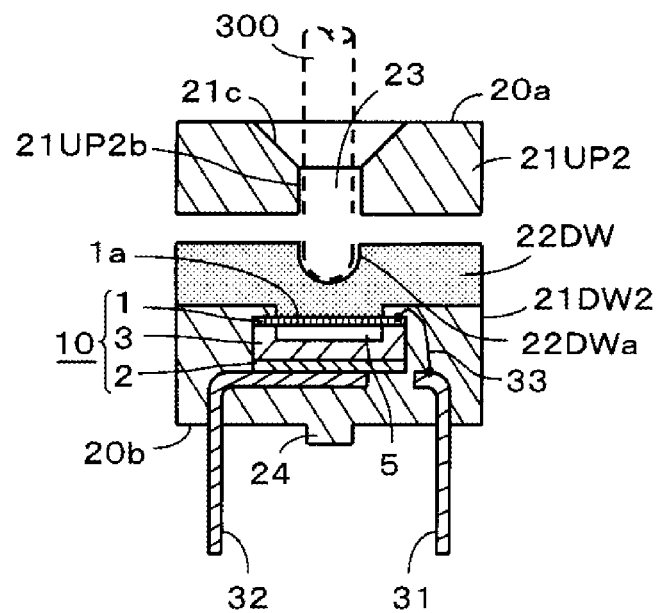

In the pressure sensing device of the above-described first embodiment, the package 20 is monolithically formed by packing silicone rubber as an example of the elastic member 22 that forms the pressure transmitting member in the recess 21a made in the package member 21. However, as shown in FIGS. 19A and 19B, the package 20 may have a configuration obtained by forming the package member consisting of an upper member and a lower member in a divided manner and bonding the upper member and lower member to each other by thermal welding or the like. FIGS. 19A and 19B show the case in which this modification example is applied to the pressure sensing device 100A of the example of FIG. 6A. Therefore, the same parts as those in FIG. 6A are given the same reference numerals, and detailed description thereof is omitted.

Specifically, in the pressure sensing device shown in FIG. 19A, the package 20 is divided into an upper package member 21UP1 and a lower package member 21DW1. A recess 21UP1a corresponding to the above-described recess 21a is formed in the upper package member 21UP1 and an elastic member 22UP composed of, for example, silicone rubber as the pressure transmitting member is disposed in the recess 21UP1a. In the case of this example, the elastic member 22UP slightly protrudes from the inside of the recess 21UP1a toward the first electrode 1 of the pressure detecting chip 10 as shown in FIG. 19A. In the upper package member 21UP1, the communication hole 23 in which the rod-shaped protruding member 300 is inserted is formed of a penetrating hole 21UP1b of the package member 21UP1 and a concave hole 22UPa formed in the elastic member 22UP.

The lower package member 21DW1 houses the pressure detecting chip 10 inside such that one surface 1a of the first electrode 1 of the pressure detecting chip 10 is exposed. Furthermore, the lead terminal 31 and the lead terminal 32 are led out from the lower package member 21DW1 in the above-described manner. In this example, in the lower package member 21DW1, a recess 21DW1a is formed above the surface 1a of the first electrode 1 of the pressure detecting chip 10 in such a manner that the surface 1a defines an exposed bottom of the recess 21DW1a, into which the protruding elastic member 22UP of the upper package member 21UP1 is fitted.

For the pressure sensing device of this example of FIG. 19A, the upper package member 21UP1 and the lower package member 21DW1 configured in the above-described manner are bonded to each other by thermal welding or the like to be made monolithic in such a manner that the protruding part of the elastic member 22UP of the upper package member 21UP1 is fitted into the recess 21DW1a of the lower package member 21DW1. Thereby, one package 20 as a whole is configured. In this example of FIG. 19A, the bottom surface of the lower package member 21DW1 serves as the bottom surface 20b of the package 20. On the bottom surface 20b, the projection 24 for alignment when the pressure sensing device is fixed to the printed wiring board is formed.

Although the upper package member 21UP1 and the elastic member 22UP are formed as different members, it is also possible to employ a pressure transmitting member that is formed of one member and is obtained by monolithically forming the upper package member 21UP1 and the elastic member 22UP with the same member, for example a resin member such as silicone rubber.

In the example of FIG. 19A, the elastic member 22UP as the pressure transmitting member is provided in the upper package member 21UP1. On the other hand, FIG. 19B shows the case in which the elastic member is provided in the lower package member.

Specifically, in this example of FIG. 19B, the package 20 is divided into an upper package member 21UP2 and a lower package member 21DW2. The lower package member 21DW2 is obtained by adhering an elastic member 22DW composed of, for example, silicone rubber, onto the lower package member 21DW1 in FIG. 19A in such a manner that the elastic member 22DW is disposed against one surface 1a of the first electrode 1 of the pressure detecting chip 10. Furthermore, a recess 22DWa that forms the tip part of the communication hole 23 is formed in the elastic member 22DW of the lower package member 21DW2 above the first electrode 1 of the pressure detecting chip 10.

The upper package member 21UP2 has a penetrating hole 21UP2b that forms the communication hole 23 together with the recess 22DWa of the elastic member 22DW. The upper package member 21UP2 and the lower package member 21DW2 are connected and bonded to each other in such a manner that the communication hole 23 is formed by the penetrating hole 21UP2b and the recess 22DWa of the elastic member 22DW.

Although the upper package member 21UP2 and the elastic member 22DW are formed as different members in the example shown in FIG. 19B, it is also possible to employ a pressure transmitting member formed of one member by forming the upper package member 21UP2 and the elastic member 22DW with the same material, for example a resin member such as silicone rubber.

In the pressure detecting chip 10 of the pressure sensing semiconductor devices of the above-described embodiments, the space 5 is formed as a circular space by the circular recess 4. However, it is obvious that the shape of the space is not limited to the circular shape.

In the above description, application examples of the pressure sensing semiconductor device according to the invention are provided to detect writing pressure of the position indicator of a position detecting device. However, application examples of the pressure sensing semiconductor device according to the invention are not limited thereto and can be applied in various other devices and electronic apparatus that utilize capacitance change based on pressing force.

In the above-described examples, the pressure detecting chip has a configuration formed of only a capacitance-variable capacitor. However, the pressure detecting chip may have a configuration obtained by forming a capacitor in series or in parallel to the capacitance-variable capacitor by a semiconductor process. Furthermore, it is obvious that the pressure detecting chip may have a configuration obtained by forming the signal processing circuit to be connected to a single body of capacitance-variable capacitor, or a capacitance-variable capacitor connected in series or parallel to another capacitor, on the same semiconductor chip by a semiconductor process.

DESCRIPTION OF REFERENCE NUMERALS

1 First electrode,
2 Second electrode,
3 Insulating layer,
4 Recess,
5 Space,
10 Pressure detecting chip,
20 Package,
21 Package member,
22 Elastic member,
23 Communication hole,
100 Pressure sensing semiconductor device

The invention claimed is:

1. A capacitive pressure sensing semiconductor device for use in a position indicator having an elongate core body including a distal end and a proximal end, the capacitive pressure sensing semiconductor device being configured to sense pressure applied to the distal end of the core body and comprising:
   a pressure detecting part that detects the pressure as a change in capacitance;
   a package in which the pressure detecting part is sealed;
   wherein the pressure detecting part includes a first electrode and a second electrode disposed to oppose the first electrode, with a determined distance between the first and second electrodes, and capacitance is formed between the first electrode and the second electrode and changes according to a change in said distance that is caused by the pressure transmitted to the first electrode via the proximal end from the distal end of the core body, and
   the capacitive pressure sensing semiconductor device further comprising a pressure transmitting member, disposed in the package, which is configured to receive, via the proximal end of the core body, the pressure applied to the distal end of the core body and to transmit the pressure to the first electrode of the pressure detecting part.

2. The capacitive pressure sensing semiconductor device according to claim 1, wherein
   the pressure transmitting member is formed monolithically with the package.

3. The capacitive pressure sensing semiconductor device according to claim 2, wherein
   the pressure transmitting member formed monolithically with the package is formed of a silicone resin material.

4. The capacitive pressure sensing semiconductor device according to claim 2, wherein
   the package and the pressure transmitting member are formed of the same material.

5. The capacitive pressure sensing semiconductor device according to claim 1, wherein
   the pressure transmitting member has determined elasticity and the pressure transmitted from the pressure transmitting member to the first electrode of the pressure detecting part is transmitted in a manner corresponding to the determined elasticity of the pressure transmitting member.

6. The capacitive pressure sensing semiconductor device according to claim 1, wherein
   a tip part of the pressure transmitting member that presses the first electrode of the pressure detecting part has a non-flat-surface shape.

7. The capacitive pressure sensing semiconductor device according to claim 6, wherein
   the non-flat-surface shape formed in the pressure transmitting member is a shape configured to change a characteristic of the capacitance as a function of the pressure transmitted by the core body.

8. The capacitive pressure sensing semiconductor device according to claim 6, wherein
   the non-flat-surface shape formed in the pressure transmitting member is a protruding shape.

9. The capacitive pressure sensing semiconductor device according to claim 1, wherein
   the package is monolithically formed by bonding a first package member that houses the pressure detecting part and a second package member having the pressure transmitting member to each other.

10. The capacitive pressure sensing semiconductor device according to claim 9, wherein
    the first package member that houses the pressure detecting part and the second package member having the pressure transmitting member are formed of materials different from each other.

11. The capacitive pressure sensing semiconductor device according to claim 1, wherein
    the package includes a recess, in which the proximal end of the core body is inserted to transmit the pressure applied to the distal end of the core body to the first electrode of the pressure detecting part.

12. The capacitive pressure sensing semiconductor device according to claim 11, wherein
    the recess is defined in the pressure transmitting member.

13. The capacitive pressure sensing semiconductor device according to claim 11, wherein
    the recess is formed in a spherical shape.

14. The capacitive pressure sensing semiconductor device according to claim 11, wherein
    the recess included in the package is formed in a cylindrical shape and the proximal end of the core body is guided by the recess to transmit the pressure applied to the distal end of the core body to the first electrode of the pressure detecting part.

15. The capacitive pressure sensing semiconductor device according to claim 14, wherein
    in the recess is provided a holder configured to hold the proximal end of the core body that transmits the pressure to the first electrode of the pressure detecting part.

* * * * *